(12) United States Patent
Higashitani et al.

(10) Patent No.: US 7,365,018 B2
(45) Date of Patent: Apr. 29, 2008

(54) FABRICATION OF SEMICONDUCTOR DEVICE FOR FLASH MEMORY WITH INCREASED SELECT GATE WIDTH

(75) Inventors: Masaaki Higashitani, Cupertino, CA (US); Tuan Pham, San Jose, CA (US); Masayuki Ichige, Yokohama (JP); Koji Hashimoto, Yokohama (JP); Satoshi Tanaka, Kawassaki (JP); Kikuko Sugimae, Yokohama (JP)

(73) Assignee: Sandisk Corporation, Milpitas, CA (US)

( * ) Notice: Subject to any disclaimer, the term of this patent is extended or adjusted under 35 U.S.C. 154(b) by 84 days.

(21) Appl. No.: 11/319,895

(22) Filed: Dec. 28, 2005

(65) Prior Publication Data

US 2007/0148973 A1 Jun. 28, 2007

(51) Int. Cl.
*H01L 21/302* (2006.01)

(52) U.S. Cl. .................. 438/717; 438/243; 438/706; 430/312

(58) Field of Classification Search ............... 438/243, 438/706, 717; 430/310.312
See application file for complete search history.

(56) References Cited

U.S. PATENT DOCUMENTS

| | | | |
|---|---|---|---|
| 5,386,422 A | 1/1995 | Endoh | |
| 5,522,580 A | 6/1996 | Varner, Jr. | |
| 5,570,315 A | 10/1996 | Tanaka | |
| 5,698,879 A | 12/1997 | Aritome et al. | |
| 5,774,397 A | 6/1998 | Endoh | |
| 5,936,887 A | 8/1999 | Choi et al. | |
| 6,046,935 A | 4/2000 | Takeuchi | |
| 6,147,911 A | 11/2000 | Takeuchi et al. | |
| 6,222,762 B1 | 4/2001 | Guterman | |
| 6,337,175 B1 | 1/2002 | Yamaguchi | |
| 6,456,528 B1 | 9/2002 | Chen | |
| 6,522,580 B2 | 2/2003 | Chen | |

(Continued)

FOREIGN PATENT DOCUMENTS

JP 08017703 1/1996

OTHER PUBLICATIONS

Suh, et al., "A 3.3 V 32 Mb NAND Flash Memory with Incremental Step Pulse Programming Scheme," 1995 IEEE Int. Solid-State Circuits Conf., Feb. 1995.

(Continued)

*Primary Examiner*—Lan Vinh
(74) *Attorney, Agent, or Firm*—Vierra Magen Marcus & DeNiro LLP

(57) ABSTRACT

A non-volatile memory device having memory elements with a channel length of, e.g., 45-55 nm or less, is fabricated using existing lithographic techniques. In one approach, patterns of first and second photomasks are transferred to the same photoresist layer. The first photomask can have openings with a given feature size F that are spaced apart by the feature size F, for instance. The second photomask has an opening which is sized to create a desired inter-select gate gap, such as 3 F or 5 F. A third photomask is used to provide protective portions in a second photoresist layer over the select gate structures. The final structure has memory elements of width F spaced apart by a distance F, and select gates of width 3 F spaced apart by 3 F or 5 F. In another approach, the patterns of three photomasks are transferred to respective photoresist layers to create an analogous final structure.

58 Claims, 17 Drawing Sheets

U.S. PATENT DOCUMENTS

| | | |
|---|---|---|
| 6,845,042 B2 | 1/2005 | Ichige et al. |
| 6,859,397 B2 | 2/2005 | Lutze |
| 7,046,568 B2 | 5/2006 | Cernea |
| 7,196,928 B2 | 3/2007 | Chen |
| 2002/0068400 A1* | 6/2002 | Kunkel et al. ............... 438/243 |
| 2003/0094635 A1 | 5/2003 | Yaegashi |
| 2004/0057287 A1 | 3/2004 | Cernea |
| 2004/0109357 A1 | 6/2004 | Cernea |
| 2004/0137375 A1 | 7/2004 | Nolscher |
| 2004/0152262 A1 | 8/2004 | Ichige |
| 2004/0255090 A1 | 12/2004 | Guterman |
| 2005/0024939 A1 | 2/2005 | Chen |
| 2005/0099847 A1 | 5/2005 | Ichige et al. |
| 2005/0276093 A1* | 12/2005 | Graham et al. ............. 365/149 |
| 2006/0105248 A1* | 5/2006 | Montgomery et al. ......... 430/5 |
| 2006/0126390 A1 | 6/2006 | Gorobets |
| 2006/0140007 A1 | 6/2006 | Cernea |
| 2006/0158947 A1 | 7/2006 | Chan |

OTHER PUBLICATIONS

Iwata, et al., "A 35 NS Cycle Time 3.3 V only 32 Mb NAND Flash EEPROM," IEEE J. of Solid State Circuits, vol. 30, No. 11, pp. 1157-1164, Nov. 1995.

International Search Report and Written Opinion dated Aug. 1, 2007, in PCT Application No. PCT/US2006/049531.

* cited by examiner

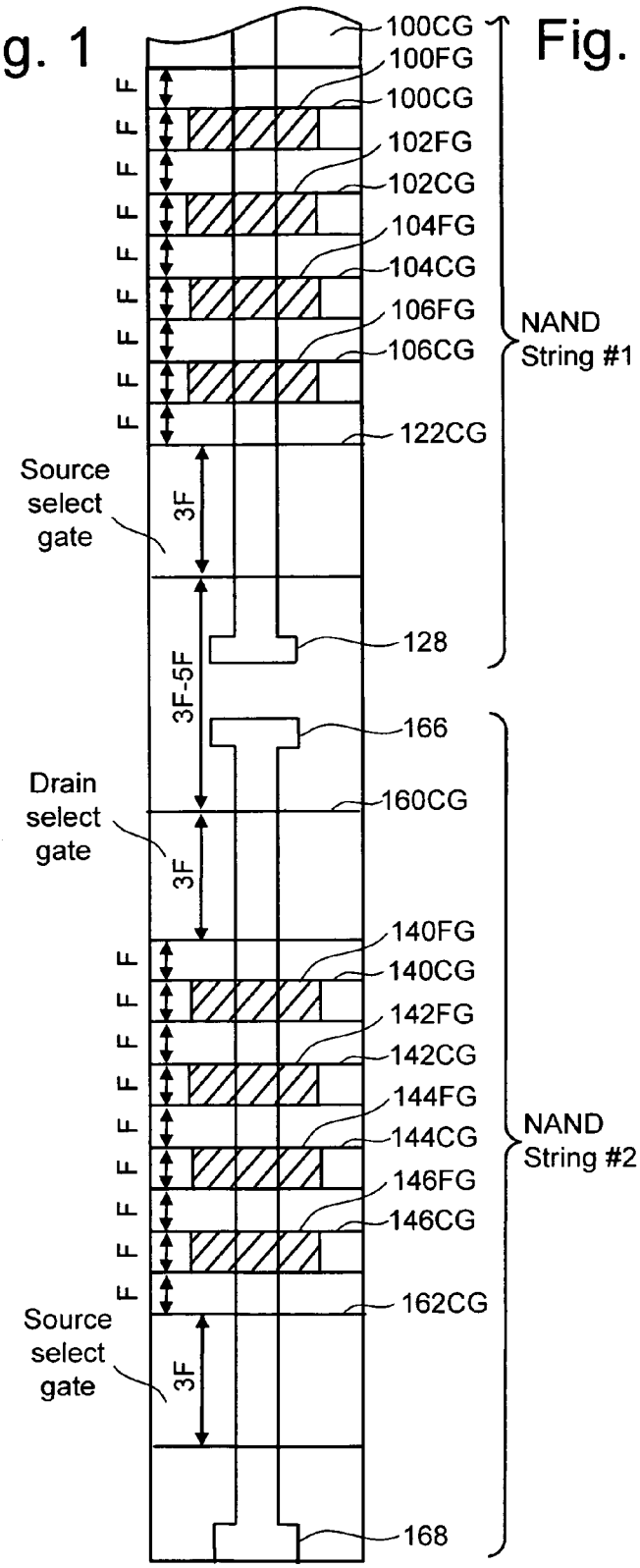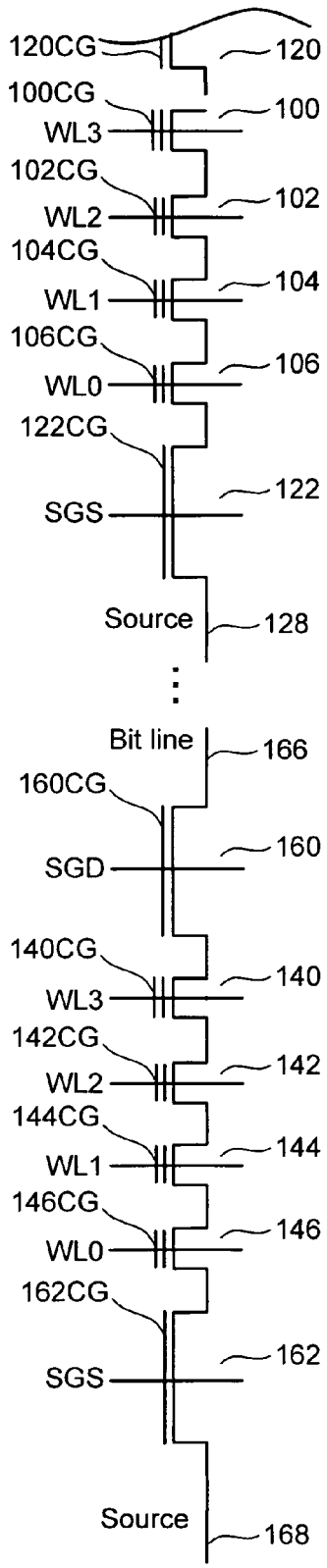

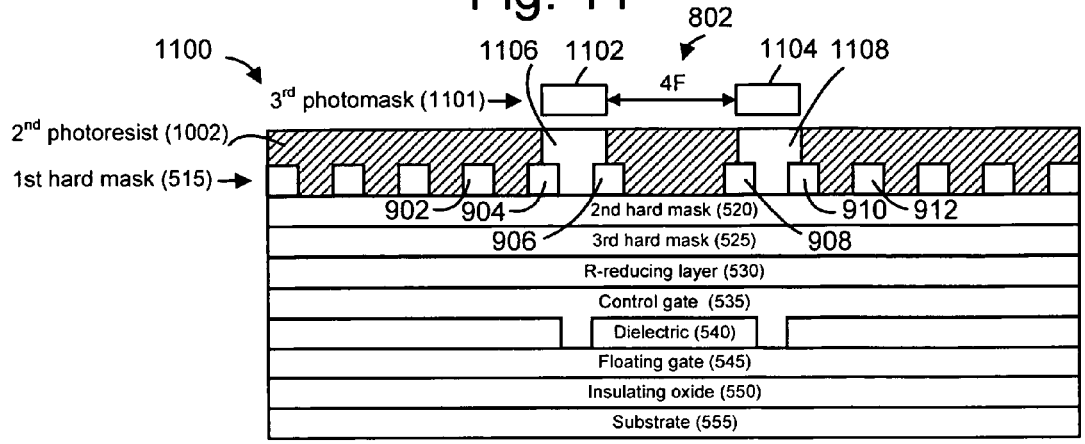
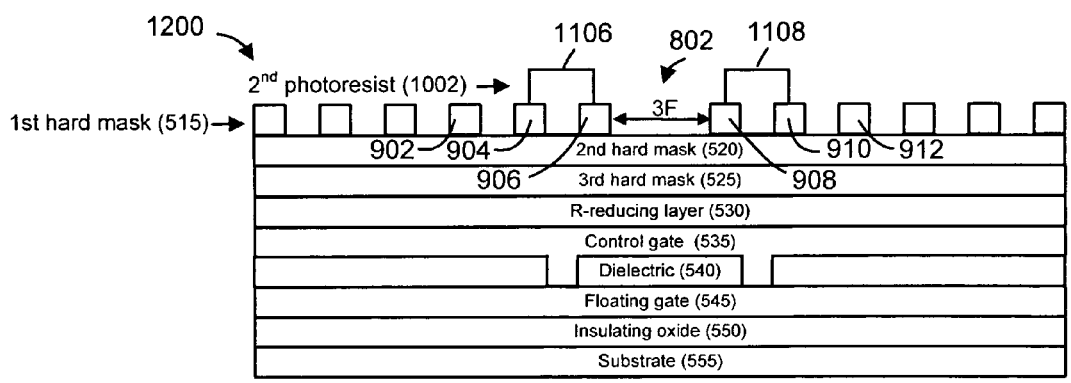
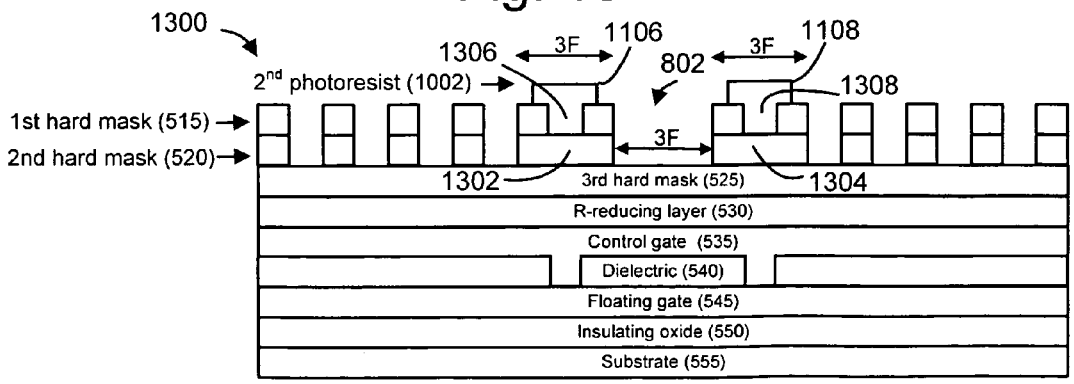

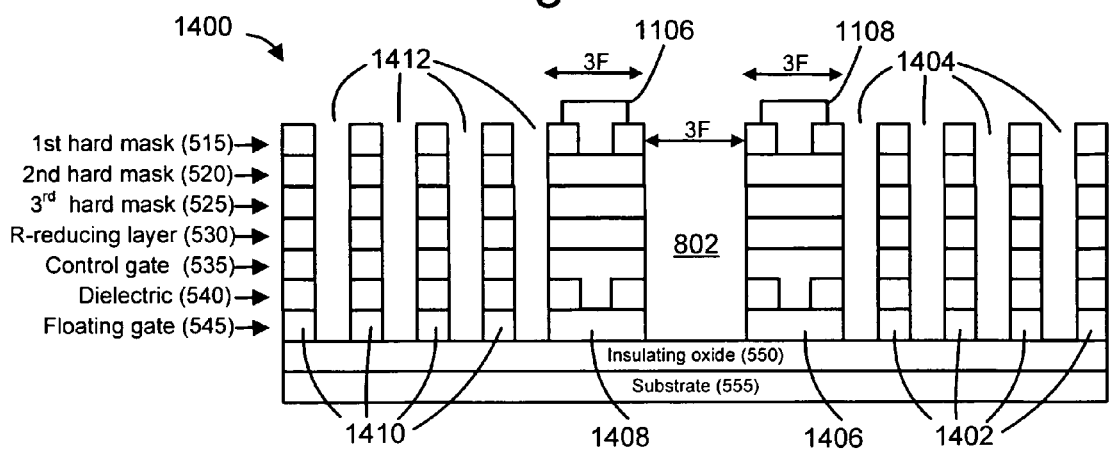
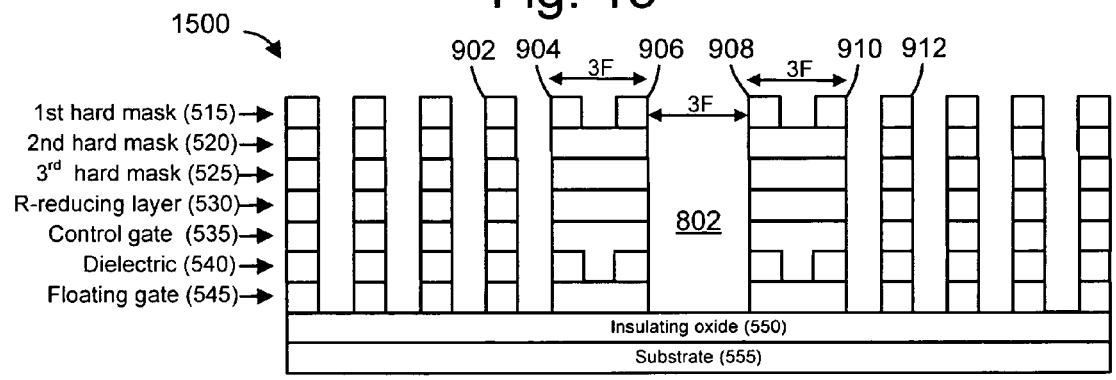
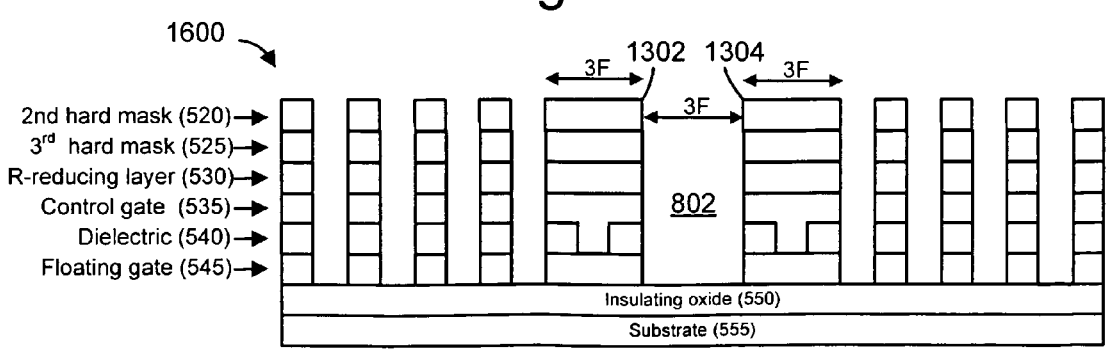

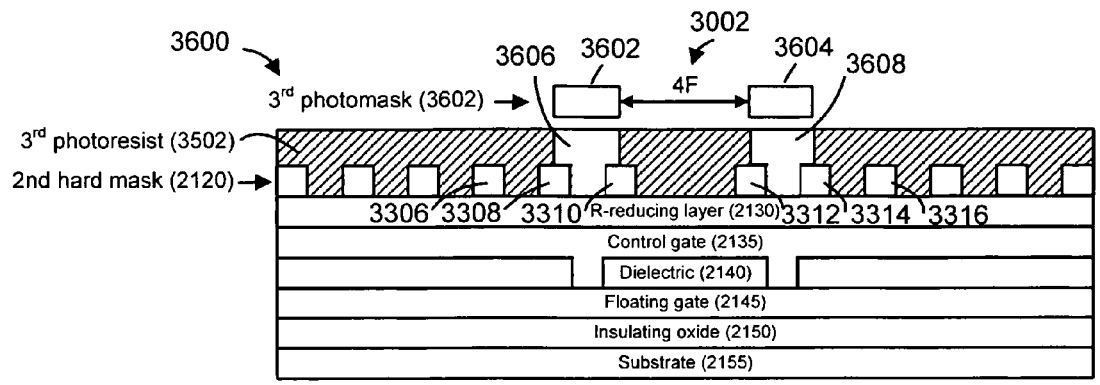
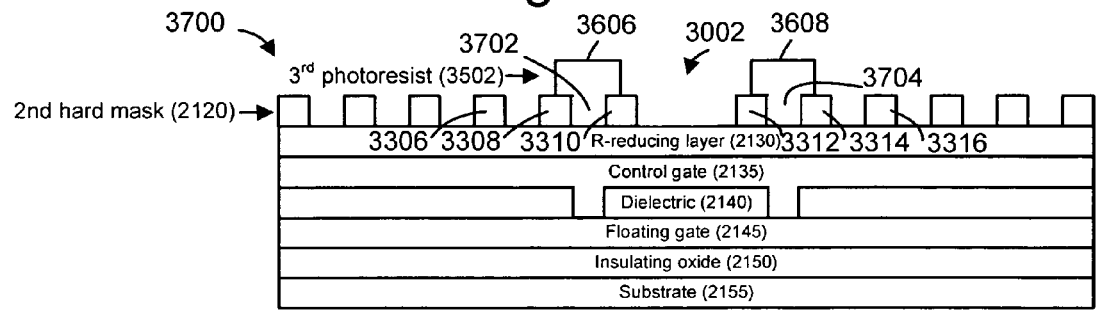
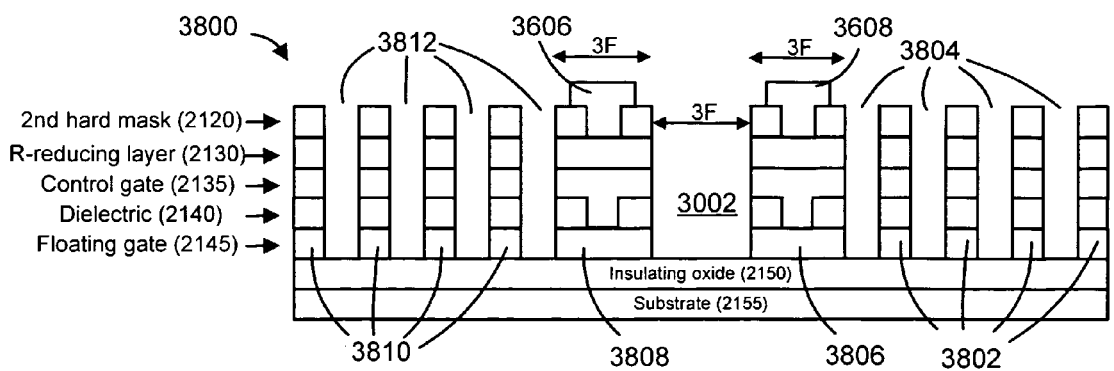

FABRICATION OF SEMICONDUCTOR DEVICE FOR FLASH MEMORY WITH INCREASED SELECT GATE WIDTH

BACKGROUND OF THE INVENTION

1. Field of the Invention

The present invention relates to fabricating a semiconductor device for non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data. A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

However, with ever decreasing channel lengths in memory elements, e.g., 45-55 nm or less, existing lithographic techniques have been found to be inadequate to implement optimal designs in non-volatile semiconductor memory devices. In particular, it has been found that minimum line space patterns can be achieved using a photomask having fixed openings with a given feature size F that are spaced apart by the feature size F, for instance. In this case, both the memory element and the select gate are constrained to having the same feature size. This approach is not optimal because relatively wider select gates are needed to prevent current leakage. Accordingly, these and other designs become problematic

SUMMARY OF THE INVENTION

A method is provided for fabricating a semiconductor device which uses minimum line space patterns while providing design flexibility.

In one embodiment, a method for fabricating a semiconductor device includes transferring patterns from first and second photomasks to the same photoresist layer of a layered structure. The first photomask has a periodic pattern of features of width F, such as openings, separated by a distance which can also be F. F=45-55 nm or less, for instance. After the pattern from the first photomask is transferred, the pattern from the second photomask is transferred. The second photomask can have a different feature size. As a result, a pattern is formed in the photoresist layer which includes a gap of, e.g., 3-5 F, based on the feature size of the second photomask. On opposing sides of the gap, spaced apart photoresist portions of width F are formed. The pattern in the photoresist layer is transferred to a hard mask below the photoresist layer, and the remaining portions of the photoresist layer are removed. Next, a pattern is transferred from a third photomask having a pattern of features of width at least F to a second photoresist layer which is added to the hard mask, thereby forming protective regions in the second photoresist layer on opposing sides of the gap. Each protective region extends over a portion of the hard mask which will become a select gate. After etching, a number of memory element structures are formed which have the width F, and select gate structures are formed under the protective regions. The select gates can have a width, e.g., 3 F, based on the feature size of the third mask.

In another embodiment, a method for fabricating a semiconductor device includes transferring patterns from three photomasks separately to a layered structure. The three photomasks may have analogous features as the above-described photomasks. However, in contrast to the above-described method in which patterns of first and second masks are transferred to the same photoresist layer, each of the three patterns is transferred to a different photoresist layer. After spaced apart photoresist portions of width F are formed in a first photoresist layer using the first photomask, hard masks below the first photoresist layer are etched. A spin-on glass film and a second photoresist layer are added to the hard masks, and the pattern from the second photomask is transferred to form a gap. The spin-on glass film below the gap is removed, the second photoresist layer is removed, and a third photoresist layer is added. The pattern from the third photomask is transferred to form the protective regions which extend over a portion of a remaining hard mask to protect the hard mask when the layered structure is etched. As before, after the etching, a select gate and a number of memory element structures are formed on each side of the gap.

BRIEF DESCRIPTION OF THE DRAWINGS

FIG. 1 is a top view of two adjacent NAND strings.

FIG. 2 is an equivalent circuit diagram of the NAND strings of FIG. 1.

FIG. 11 depicts transferring of the pattern of a third photomask to the layered semiconductor material of FIG. 10.

FIG. 12 depicts unexposed portions of the second photoresist layer of the layered semiconductor material of FIG. 11.

FIG. 13 depicts the layered semiconductor material of FIG. 12 after a second hard mask layer is removed.

FIG. 14 depicts the layered semiconductor material of FIG. 13 after etching is performed down to an oxide layer.

FIG. 15 depicts a layered semiconductor material of FIG. 14 after the unexposed portions of the second photoresist layer are removed.

FIG. 16 depicts the layered semiconductor material of FIG. 15 after remaining portions of the first hard mask layer are removed.

FIG. 36 depicts the transferring of a pattern from a third photomask to the layered semiconductor material of FIG. 35.

FIG. 37 depicts remaining unexposed portions of the third photoresist layer of the layered semiconductor material of FIG. 36.

FIG. 38 depicts the layered semiconductor material of FIG. 37 after etching is performed down to an oxide layer.

DETAILED DESCRIPTION

Figure 3:
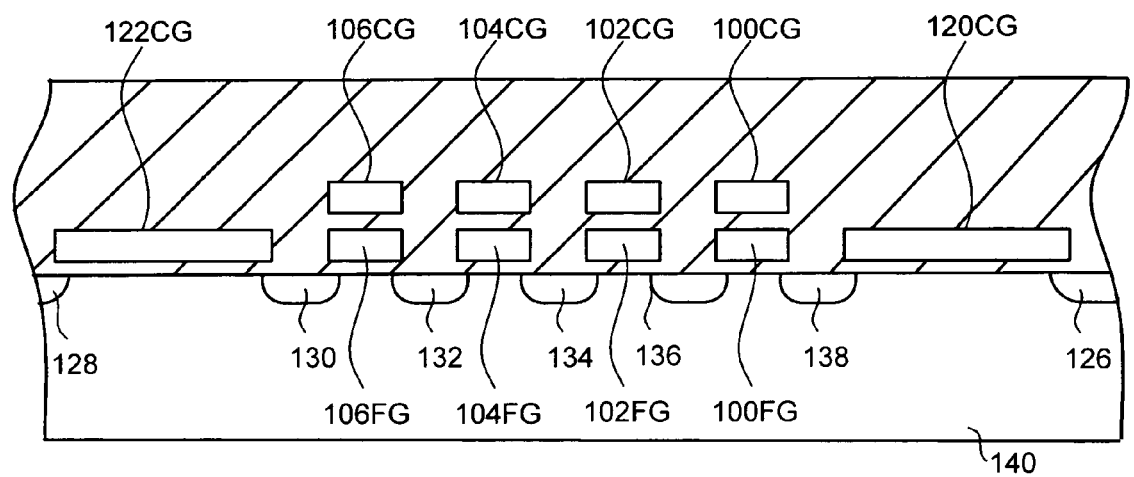
FIG. 3 is a cross-sectional view of one of the NAND strings of FIG. 1.

One example of a non-volatile memory system suitable for use with the present invention uses the NAND flash memory structure, in which multiple transistors are arranged in series between two select gates in a NAND string. FIG. 1 is a top view showing two NAND strings arranged one after another. The NAND strings depicted in FIGS. 1 and 2 each include four transistors in series and sandwiched between select gates. For example NAND string #1 includes transistors 100, 102, 104 and 106 sandwiched between a first, drain select gate 120 and a second, source select gate 122, and NAND string #2 includes transistors 140, 142, 144 and 146 sandwiched between a first, drain select gate 160 and a second, source select gate 162. Note that the depiction of one end region of NAND string #1 has been cut off at the control gate 120CG on the drain side.

In NAND string #1, for instance, select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 10FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or storage elements. In other designs, the memory elements may include multiple transistors or may be different than those depicted in FIGS. 1 and 2. Select gate 120 is connected to drain select line SGD, while select gate 122 is connected to source select line SGS. NAND string #2 is arranged analogously to NAND string #1, and includes a contact 166 which is connected to a bit line on a drain side of the NAND string, while a contact 168 is connected to the common source select gate voltage. In practice, a number of such NAND string can be arranged one after another in a two-dimensional array across a semiconductor device.

In one possible implementation, F denotes the width of the word line, control gate and the floating gate of each memory element, as well as the spacing between memory elements, 3 F denotes the widths of the source and drain select gates, and 3 F or 5 F denotes a gap between the select gates of the adjacent NAND strings which is used for locating the contacts. In particular, designs in which the select gates are wider than the memory elements are useful to prevent current leakage through the select gates. By fabricating the device as discussed herein, a non-volatile memory device with a gate width of approximately 45-55 nm or less, for instance, can be achieved using current lithographic techniques. In particular, when the feature size of the memory elements is a minimum photomask feature size F, a feature size of the select gates and inter-select gate gap can be provided as multiples of F.

FIG. 3 provides a cross-sectional view of the above-described NAND string #1. The transistors, or memory elements, of the NAND string are formed in a p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings. As indicated, the width of the control gates 120CG and 122CG is wider than that of the memory elements to reduce or prevent current leakage through the control gates 120CG and 122CG.

Note that although FIGS. 1-3 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Each memory element can store data represented in analog or digital form. When storing one bit of digital data, the range of possible threshold voltages of the memory element is divided into two ranges, which are assigned logical data "1" and "0." In one example of a NAND-type flash memory, the voltage threshold is negative after the memory element is erased, in what may be defined as the logic "1" state. The threshold voltage is positive after a program operation, in what may be defined as the logic "0" state. When the threshold voltage is negative and a read is attempted by applying 0 V to the control gate, the memory element will turn on to indicate logic one is being stored. When the threshold voltage is positive and a read operation is attempted by applying 0 V to the control gate, the memory element will not turn on, which indicates that logic zero is stored.

A memory element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory element and the threshold voltage ranges of the element depends upon the data encoding scheme adopted for the memory elements. For example, U.S. Pat. No. 6,222,762 and U.S. patent application Ser. No. 10/461,244, "Tracking Cells For A Memory System," filed on Jun. 13, 2003, and published as U.S. Patent Application Publication 2004/0255090 on Dec. 16, 2004, both of which are incorporated herein by reference in their entirety, describe various data encoding schemes for multi-state flash memory elements.

Relevant examples of NAND-type flash memories and their operation are provided in U.S. Pat. Nos. 5,386,422, 5,570,315, 5,774,397, 6,046,935, 6,456,528 and 6,522,580, each of which is incorporated herein by reference in its entirety. Other types of non-volatile memory, in addition to NAND flash memory, can also be used with the present invention.

Another type of memory element useful in flash EEPROM systems is the charge trapping element, which utilizes a non-conductive dielectric material in place of a conductive floating gate to store charge in a non-volatile manner. Such an element is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory element channel. The element is programmed by injecting electrons from the element channel into the nitride, where they are trapped and stored in a limited region. This stored charge then changes the threshold voltage of a portion of the channel of the element in a manner that is detectable. The element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar element in a split-gate configuration where a doped polysilicon gate extends over a portion of the memory element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory elements described in this paragraph can also be used with the present invention.

Another approach to storing two bits in each element has been described by Eitan et al., "NROM: A Novel Localized Trapping, 2-Bit Nonvolatile Memory Cell," IEEE Electron Device Letters, vol. 21, no. 11, November 2000, pp. 543-545, which describes an ONO dielectric layer that extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory elements described in this paragraph can also be used with the present invention.

Figure 4:
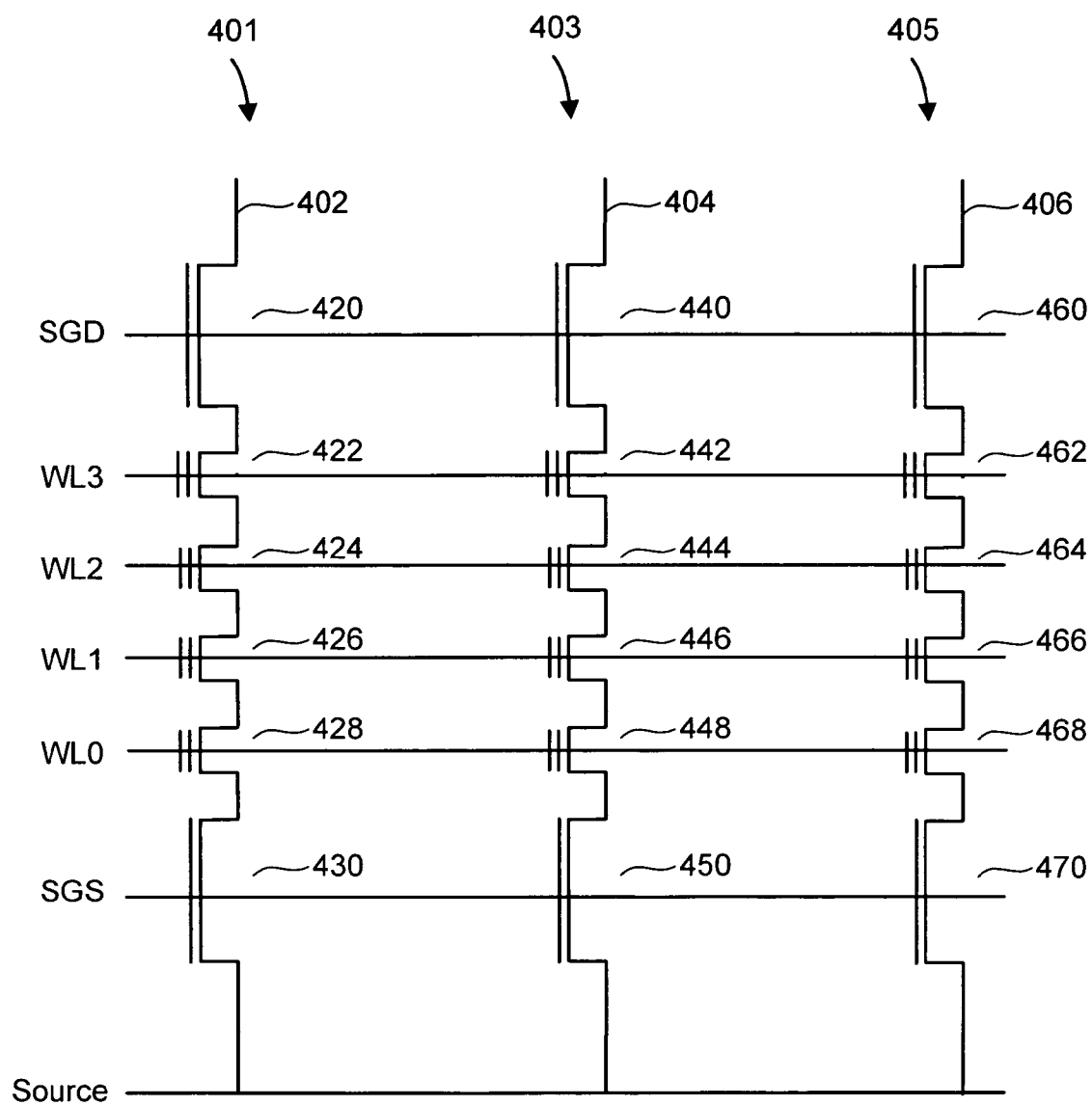
FIG. 4 is a circuit diagram depicting three NAND strings.

FIG. 4 is a circuit diagram depicting three NAND strings. A typical architecture for a flash memory system using a NAND structure will include several sets of NAND strings arranged successively. For example, three NAND strings 401, 403 and 405 are shown in a memory array having many more NAND strings. Each of the NAND strings includes two select transistors and four memory elements. For example, NAND string 401 includes select transistors 420 and 430, and memory elements 422, 424, 426 and 428. NAND string 403 includes select transistors 440 and 450, and memory elements 442, 444, 446 and 448. NAND string 405 includes select transistors 460 and 470, and memory elements 462, 464, 466 and 468. Each NAND string is connected to the source line by its select transistor (e.g., select transistor 430, 450 or 470). A selection line SGS is used to control the source side select gates. The various NAND strings 401, 403 and 405 are connected to respective bit lines 402, 404 and 406, by select transistors 420, 440, 460, etc., which are controlled by drain select line SGD. In other embodiments, the select lines do not necessarily need to be in common. Word line WL3 is connected to the control gates for memory elements 422, 442 and 462. Word line WL2 is connected to the control gates for memory elements 424, 444 and 464. Word line WL1 is connected to the control gates for memory elements 426, 446 and 466. Word line WL0 is connected to the control gates for memory elements 428, 448 and 468. As can be seen, each bit line and the respective NAND string comprise the columns of the array or set of memory elements. The word lines (WL3, WL2, WL1 and WL0) comprise the rows of the array or set. Each word line connects the control gates of each memory element in the row. For example, word line WL2 is connected to the control gates for memory elements 424, 444 and 464.

Each memory element can store data (analog or digital). When storing one bit of digital data, the range of possible threshold voltages of the memory element is divided into two ranges which are assigned logical data "1" and "0." In one example of a NAND type flash memory, the voltage threshold is negative after the memory element is erased, and defined as logic "1." The threshold voltage after a program operation is positive and defined as logic "0." When the threshold voltage is negative and a read is attempted, the memory element will turn on to indicate logic one is being stored. When the threshold voltage is positive and a read operation is attempted, the memory element will not turn on, which indicates that logic zero is stored. A memory element can also store multiple levels of information, for example, multiple bits of digital data. In this case, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in U.S. Pat. Nos. 5,522,580, 5,570,315, 5,774,397, 6,046,935 and 6,456,528, each of which is incorporated herein by reference.

When programming a flash memory element, a program voltage is applied to the control gate of the element and the bit line associated with the element is grounded. Electrons from the channel are injected into the floating gate. When electrons accumulate in the floating gate, the floating gate becomes negatively charged and the threshold voltage of the element is raised. To apply the program voltage to the control gate of the element being programmed, that program voltage is applied on the appropriate word line. As discussed above, that word line is also connected to one element in each of the other NAND strings that share the same word line. For example, when programming element 424 of FIG. 4, the program voltage will also be applied to the control gate of element 444.

EXAMPLE #1

Fabrication using Double Exposure of a Single Photoresist Layer Followed by Exposure of a Second Photoresist Layer A first example implementation is provided for fabricating a semiconductor memory device having a gate width as small as approximately 45-55 nm or less using existing lithographic techniques in which a photomask having a fixed periodic feature size F is used. In this example, a first photoresist layer is patterned using two photomasks, while a second photoresist layer is patterned using a third photomask.

Figure 5:
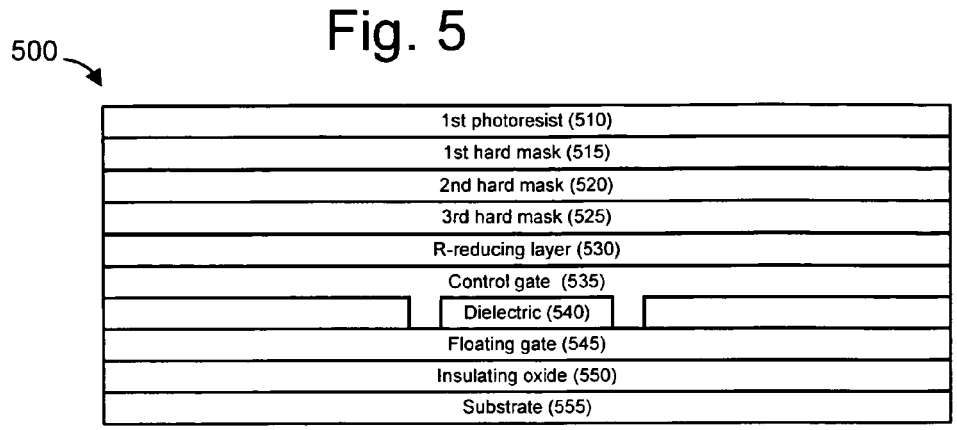
FIG. 5 depicts a cross-sectional view of an unpatterned layered semiconductor material.

FIG. 5 depicts a starting layered semiconductor material 500 which includes a substrate wafer layer 555 and a number of surface layers, including an insulating oxide layer 550, a floating gate layer 545, a dielectric layer 540, a control gate layer 535, a resistance (R)-reducing layer 530 that tends to reduce the resistance of the device, a third hard mask layer 525, a second hard mask layer 520, a first hard mask layer 515 and a first photoresist layer 510. The substrate 555 may be a silicon substrate, the insulating oxide layer 550 can include a gate oxide layer or tunneling oxide layer, and the floating gate layer 545 and control gate later 535 can include polysilicon layers. The dielectric layer 540 is interrupted periodically by portions of the control gate layer 535 which communicate with the floating gate layer 545. Note that the cross-sectional view shown represents only a slice through the layered semiconductor material, and the view similarly cutoff on each end of the layered semiconductor material. The middle portion of the layered semiconductor material 500 corresponds to an inter-select gate region between NAND strings, in one approach.

Although three hard masks are provided in the example illustrated, this is not required. For example, only two hard masks can be used. One of the hard masks, e.g., the first hard mask 515, is etched selectively against the other hard mask, e.g., the second hard mask 520. The first hard mask 515 is used to provide a minimum line space, which becomes the word line line space, after a first exposure. After a second exposure, the first hard mask 515 also includes a select gate-to-select gate space.

The first hard mask 515 can include a silicon dioxide (silica) $SiO_2$ type material such as porous silicon dioxide (P—$SiO_2$), tetraethylorthosilicate (TEOS), silicon dioxide ($SiO_2$) or spin-on glass (SOG), while the second hard mask 520 can include a silicon nitride ($Si_3N_4$) type material such as porous silicon nitride (P—$Si_3N_4$) or a chemical vapor deposition silicon nitride (CVD-$Si_3N_4$). In another approach, the first hard mask 515 can include the $Si_3N_4$ type material such as P—$Si_3N_4$ or CVD-$Si_3N_4$, while the second hard mask 520 includes the $SiO_2$ type material such as P—$SiO_2$, TEOS, P—$SiO_2$ or SOG. In the above examples, silicon oxynitride $Si_2N_2O$ can be used instead of $Si_3N_4$.

Note also that all layers are shown as being uniform in thickness for simplicity. In practice, the thicknesses of the layers will differ. For example, the first hard mask 515 can be very thin, e.g., approximately 5 nm to 10 nm. During the etching of the second hard mask 520, the first hard mask 515 should still be present. After the second hard mask 520 is etched, it can become the hard mask for etching the gate. Moreover, in the case of a floating gate device, the dielectric layer 540 can be etched during the gate etch. The second hard mask 520 should remain after the etching of the dielectric layer 540 to provide a hard mask for etching the floating gate layer 545. Therefore, if the dielectric layer 540 uses an inter-polydielectric (IPD) such as an oxide-nitride-oxide (ONO) layer, the second hard mask 520 should be thicker than the dielectric layer 540.

In another approach, the dielectric layer 540 may include a high dielectric constant (high-k) material such as hafnium oxide ($HfO_2$), hafnium silicate ($HfSiO_4$), hafnium silicon oxynitride (HfSiON), aluminum oxide ($Al_2O_3$) or hafnium aluminum oxide ($HfAl_2O_3$), in which case the thickness depends on the material used. The high-k materials generally have a slower etch rate than $SiO_2$ or $Si_3N_4$. Thus, a thicker second hard mask 520 should be used with high-k materials. The third hard mask 525 may also be needed in this case. The resistance reducing layer 530, which is optionally used, may include, e.g., a metal such as tungsten W, or a metal silicide such as tungsten silicide ($WSi_2$) or cobalt silicide ($CoSi_2$). If salicidation is used, the resistance reducing layer 530 is not needed during the gate etch.

Generally, when etching, a straight etch profile should be sought, avoiding a bowing, tapered profile, due to the cell source/drain (S/D) junction implant and C-ratio, or capacitance tuning ratio. Additionally, gouging of the substrate 555 should be avoided to prevent a short channel effect. The etch should therefore stop at the insulating oxide layer 550. Also, during etching of the dialectic layer 540, it should be ensured that the first hard mask layer 515 has been removed.

Figure 6:
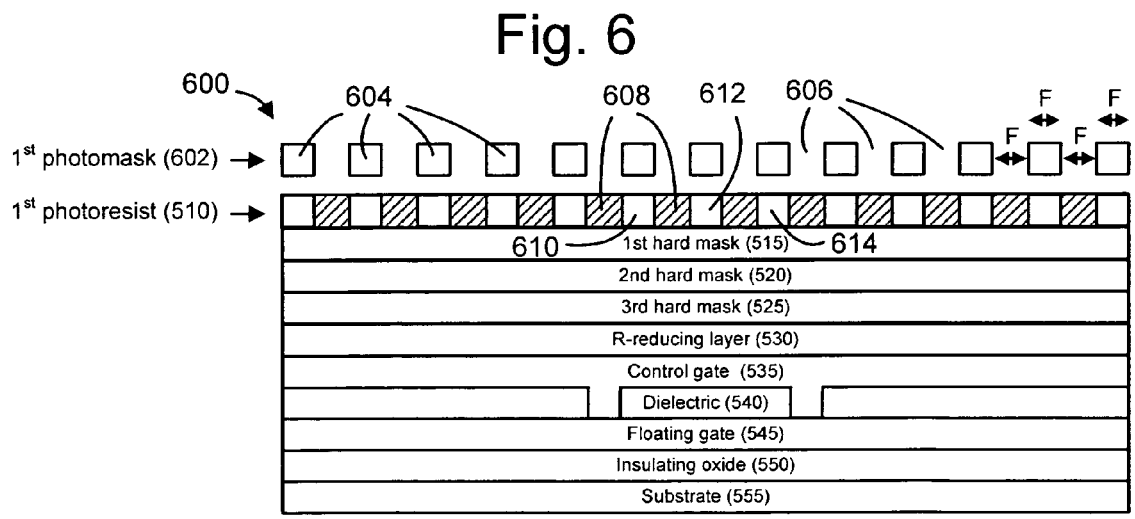
FIG. 6 depicts the transferring of a pattern of a first photomask to the layered semiconductor material of FIG. 5.

In FIG. 6, a first photomask 602 is aligned with the layered semiconductor material 600. The first photomask 602 may include openings of width F spaced apart by a distance F extending uniformly in two dimensions across the top of the layered semiconductor material. In particular, the first photomask 602 includes opaque regions, such as opaque regions 604, separated by openings, such as openings 606. The pattern of the first photomask 602 is transferred to the first photoresist layer 510 by exposing portions of the first photoresist layer 510 to ultraviolet (UV) light or other radiation through the openings in the first photomask 602. That is, when a positive photoresist is used, the photoresist is exposed to the UV light wherever the photoresist material is to be removed, while the opposite is true when a negative photoresist is used. The fabrication processes discussed herein can be modified in a manner which should be apparent to those skilled in the art for use with negative photoresists. The chemical structure of the exposed portions of the first photoresist layer 510 is changed so that the exposed portions become more soluble in a developer. As a result, a pattern is formed in the first photoresist layer 510 with alternating exposed portions, such as exposed portions 608, and unexposed portions, such as unexposed portions 610, 612 and 614, in accordance with the pattern of the first photomask 602.

Subsequently, in FIG. 7, the first photomask 602 is removed and a second photomask 702 is applied to the layered semiconductor material 700. The second photomask 702 includes opaque portions 704 and 706 separated by an opening 708, for instance. The opaque portions block the UV light during an exposure. The opening 708 is sized to expose a portion of the first photoresist layer 510 which will ultimately form an inter-select gate gap. In the present example, the desired inter-select gate gap is 3 F, so the opening 708 is sized to expose the unexposed portion 612 (FIG. 6) of the first photoresist layer 510. The opening 708 should be slightly wider than the region which is to be exposed to ensure that the region is fully exposed but not so wide that neighboring unexposed regions, e.g., regions 610 and 614, are also exposed. In the present example, the width of the opening 708 should be greater than F but less than 3 F, the width of the inter-select gate gap which is subsequently formed. An opening of approximately 2 F may be used, for instance.

Figure 7:
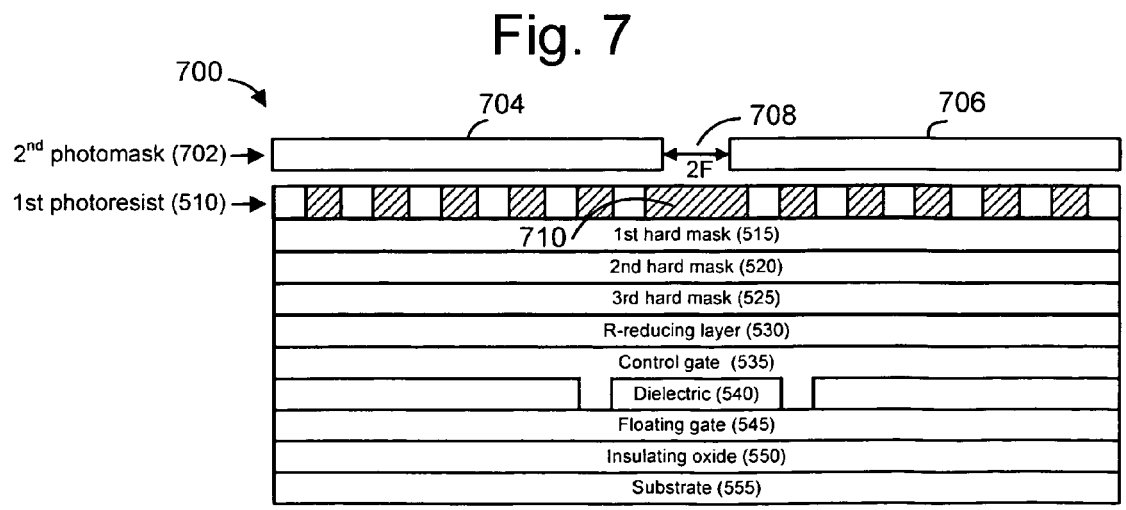
FIG. 7 depicts the transferring of the pattern of a second photomask to the layered semiconductor material of FIG. 6.

When the unexposed portion 612 of the first photoresist layer 510 is exposed through the opening 708 in the second photomask 702, a widened exposed region 710 results (FIG. 7). Subsequently, the second photomask 702 is removed, and the first photoresist layer 510 is removed, e.g., by exposing and developing. The exposed portions of the first photoresist layer 510 are consequently removed, resulting in the layered semiconductor material 800 of FIG. 8.

Figure 8:
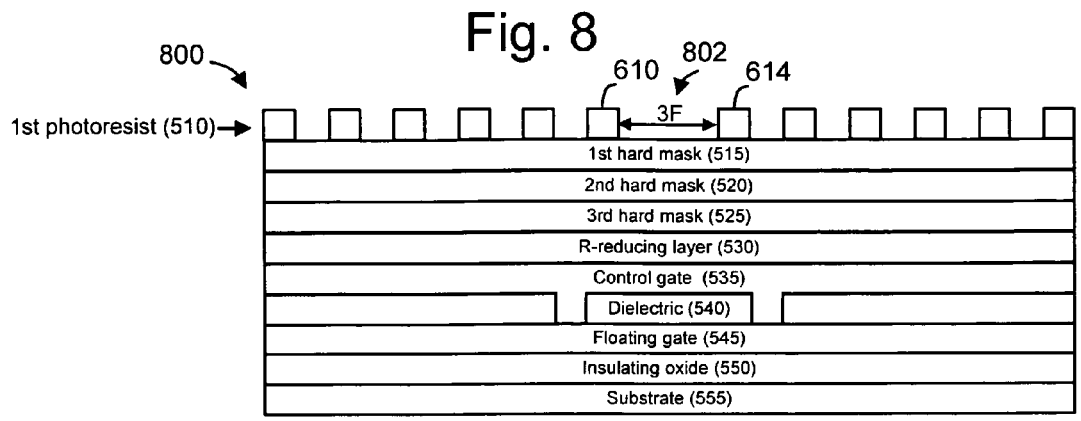
FIG. 8 depicts unexposed portions of the first photoresist layer of the layered semiconductor material of FIG. 7.

FIG. 8 depicts unexposed portions of the first photoresist layer of the layered semiconductor material of FIG. 7. In particular, in the layered semiconductor material 800, the first photoresist layer 510 includes a gap 802 of 3 F and spaced apart unexposed photoresist portions, each of width F, on each side of the gap 802. Furthermore, the unexposed photoresist portions may be spaced apart by the distance F. For example, unexposed photoresist portions 610 and 614 are provided on each side of the gap 802. The gap 802 can be considered to be an inter-select gate gap since select gates will be ultimately formed on either side of the gap. Note that the gap of 3 F is shown is an example only as other gaps widths may be used. For example, a gap of 5 F may be used, in which case the second photomask has an opening of, e.g., 4 F, which is sized for removing two unexposed portions of the first photoresist layer 510. See also FIGS. 18 and 19, discussed further below. In the layered semiconductor material 800, the first hard mask layer 515 is etched through the openings in the unexposed portions of the first photoresist layer 510, resulting in the layered semiconductor material 900 of FIG. 9.

Figure 9:
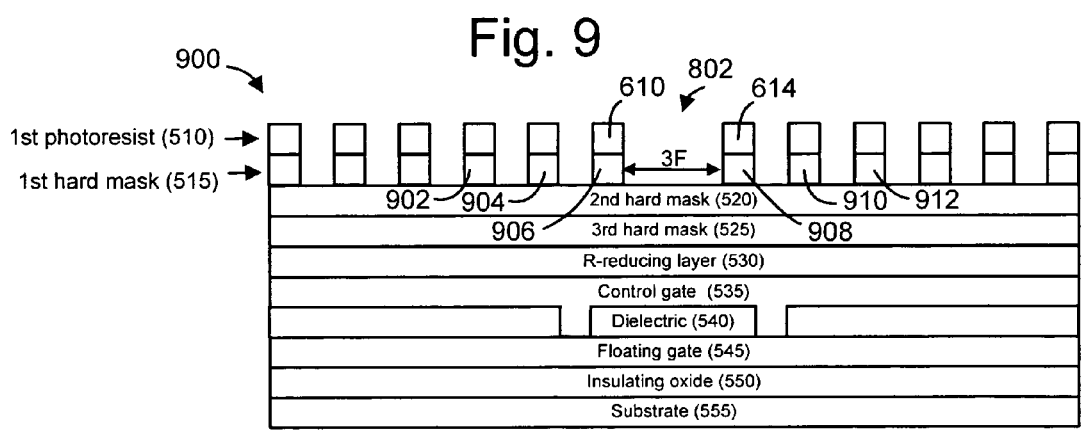
FIG. 9 depicts the layered semiconductor material of FIG. 8 after a first hard mask layer is removed.

In particular, in FIG. 9, the first hard mask layer 515 includes portions which are aligned with the unexposed portions of the first photoresist layer 510. For example, portions 906 and 908 of the first hard mask layer 515, which are provided on either side of the gap 802, are aligned with the portions 610 and 614, respectively, of the first photoresist layer 510, and therefore spaced apart by 3 F. The first hard mask layer portions 906 and 908 are first closest to the gap 802, while first hard mask layer portions 904 and 910 are second closest to the gap 802, and the first hard mask layer portions 902 and 912 are third closest to the gap 802. Thus, the patterns of the first and second photomasks 602 and 702 are transferred to the first photoresist layer 510, and the pattern of the resulting first photoresist layer 510 is transferred to the first hard mask layer 515. Subsequently, the remaining unexposed portions of the first photoresist layer 510 are moved, resulting in the layered semiconductor material 1000 of FIG. 10.

Figure 10:
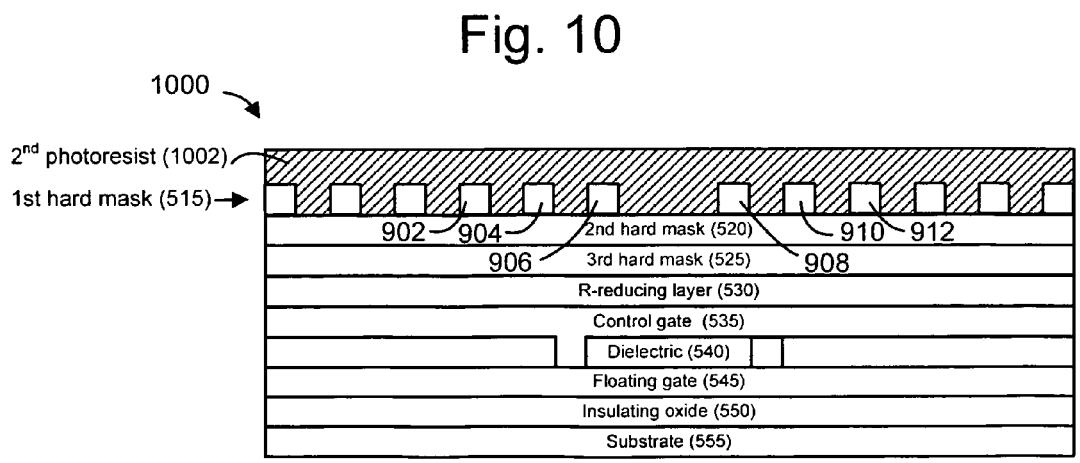
FIG. 10 depicts the layered semiconductor material of FIG. 9 after a second photoresist layer is applied.

In the layered semiconductor material 1000 of FIG. 10, a second photoresist layer 1002 is applied over the first hard mask layer 515. Subsequently, in the layered semiconductor material 1100 of FIG. 11, a pattern of a third photomask 1101 is transferred to the second photoresist layer 1002. The third photomask 1101 includes opaque portions 1102 and 1104. After exposure, unexposed photoresist portions 1106 and 1108 remain on opposing sides of the gap 802. The width of the opaque portions 1102 and 1104 is sized based on a desired width of the select gates. For example, when the desired width of the select gates is 3 F, the opaque regions 1102 and 1104, and the resulting unexposed photoresist portions 1106 and 1108, respectively, should be sufficient to cover the space between two of the unexposed portions of the first hard mask 515 which are first and second closest to the gap 802 on each side. For example, on one side of the gap 802, the unexposed second photoresist portion 1106 extends between the first hard mask layer portions 904 and 906, and on the other side of the gap, the second unexposed photoresist portion 1108 extends between the first hard mask portions 908 and 910. Theoretically, the width of the opaque portions 1102 and 1104 and the unexposed photoresist portions 1106 and 1108 could be as small as F, which is the space between the first hard mask portions 904 and 906, or 908 and 910. But, this assumes a perfect alignment of the third photomask 1101. In practice, the unexposed photoresist portions 1106 and 1108 can also extend at least partly across and cover portions of the neighboring unexposed portions of the first hard mask 515, e.g., portions 904 and 906, or portions 908 and 910. Moreover, the opening between the opaque regions 1102 and 1104 should be at least as great as the desired inter-select gate gap 802. For example, when the desired gap is 3 F, the spacing between the opaque regions 1102 and 1104 may be approximately 4 F. The third photomask 1101 is subsequently removed, and the unexposed portions of the second photoresist layer 1002 are removed, e.g., by exposing and developing, resulting in the layered semiconductor material 1200 of FIG. 12.

The layered semiconductor material 1200 includes the alternating first hard mask-portions, each of width F and spaced apart from one another by a distance F, on both sides of the gap 802, and the unexposed portions 1106 and 1108 of the second photoresist layer 1002. Subsequently, the second hard mask 520 is etched through the openings in the first hard mask, including the gap 802, resulting in the layered semiconductor material 1300 of FIG. 13, in which the pattern of the first hard mask 515 is transferred to the second hard mask 520.

The remaining second hard mask portions include portions 1302 and 1304, each of width 3 F, on opposing sides of the gap 802. In the present example, 3 F is the width of the resulting select gates in the final device. During the etching of the second hard mask 520, the unexposed portions 1106 and 1108 of the second photoresist layer 1002 protect the opening between the two first hard mask portions which are closest to the gap 802 on either side of the gap 802, e.g., openings 1306 and 1308. The unexposed portions 1106 and 1108 may therefore be considered to be protective portions of the second photoresist layer 1002. The unexposed portions 1106 and 1108 of the second photoresist layer 1002 may be worn away somewhat during this etch. A further etch is performed to etch away additional layers of the layered semiconductor material 1300, resulting in the layered semiconductor material 1400 of FIG. 14.

In particular, the layered semiconductor material 1400 is etched down to the insulating oxide layer 550, resulting in a number of memory element and select gate structures. For example, on one side of the gap 802, a select gate 1408 is provided, along with memory elements 1410 which are spaced apart by gaps 1412, while on the other side of the gap 802, a select gate 1406 is provided, along with memory elements 1402 which are spaced apart by gaps 1404. Subsequently, the unexposed portions 1106 and 1108 of the second photoresist layer 1002 are removed, e.g., by exposing and developing, resulting in the layered semiconductor material 1500 of FIG. 15.

A further etch is applied to the layered semiconductor material 1500 to remove the remaining portions of first hard mask 515, including first hard mask portions 902, 904, 906, 908, 910 and 912, resulting in the layered semiconductor material 1600 of FIG. 16. The layered semiconductor material 1600 depicts the portions 1302 and 1304 of the second hard mask 520 which are adjacent to the gap 802. Subsequently, a further etch is applied to the layered semiconductor material 1600 to remove the remaining second hard mask portions 520, resulting in the layered semiconductor material 1700 of FIG. 17.

Figure 17:
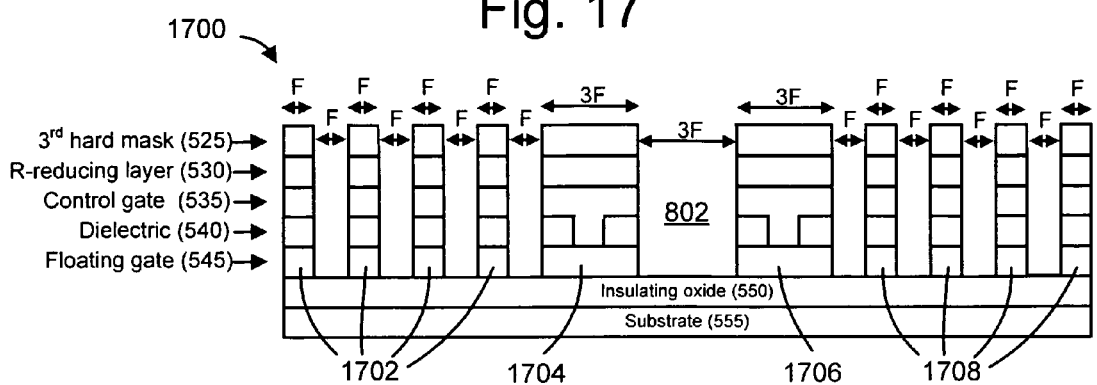
FIG. 17 depicts the layered semiconductor material of FIG. 16 after remaining portions of the second hard mask layer are removed.

FIG. 17 represents the final layered semiconductor material, which includes select gates and memory elements on opposing sides of the gap 802. For example, memory elements 1702 and select gate 1704 are provided on one side of the gap 802, while memory elements 1708 and select gate 1706 are provided on the other side. The select gates 1704 and 1706 and the gap 802 each have a width of 3 F, while the memory elements have a width F and are spaced apart by distance F, in one design. Note that one NAND string could include the select gate 1704 and the memory elements 1702 as well as other memory elements, while another NAND string could include the select gate 1706 and the memory elements 1708 as well as other memory elements. Recall that the layered semiconductor material 1700 represents only a portion of an entire non-volatile memory device. In practice, the structure shown can be repeated periodically in two dimensions to form a number of NAND string arrays across the substrate layer 555. In addition, the structure shown does not necessarily represent all memory elements in a NAND string.

Figure 18:
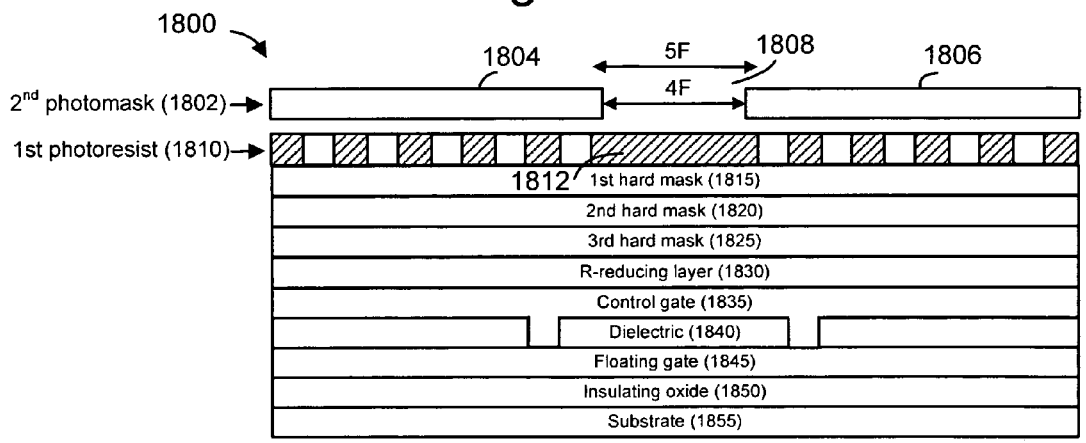
FIG. 18 depicts an alternative to the layered semiconductor material of FIG. 7, in which the inter-select gate gap is 5 F rather than 3 F.

As mentioned, the width of inter-select gate gap 802 can be varied. For example, FIG. 18 depicts a layered semiconductor material 1800 which includes a substrate layer 1855, an insulating oxide layer 1850, a floating gate layer 1845, a dielectric layer 1840, a control gate layer 1835, a resistance reducing layer 1830, a third hard mask layer 1825, a second hard mask layer 1820, a first hard mask layer 1815, and a first photoresist layer 1810. In the material 1800, the gap is increased to 5 F by using a second photomask 1802 with opaque regions 1804 and 1806 separated by an opening 1808 of approximately 4 F. In this case, the width of the opening 1808 is sufficient to expose two of the remaining unexposed portions of the first photoresist layer 1810 which result after the pattern of the first photomask is transferred to the first photoresist layer. An exposed region 1812 having a width of 5 F results in the first photoresist layer 1810 when the pattern of the second photomask 1802 is transferred. Generally, inter-select gate gaps of 3 F, 5 F, and so forth can be created.

Similarly, the select gate width can be increased to 5 F or greater, for instance. For example when a select gate width of 5 F is desired, the third photomask 1101 as depicted in FIG. 11 can be modified so that the opaque portions 1102 and 1104 are wide enough to extend between the first hard mask portions which are first and third closest to the gap on each side, e.g., portions 902 and 906, or portions 908 and 912.

Figure 19:
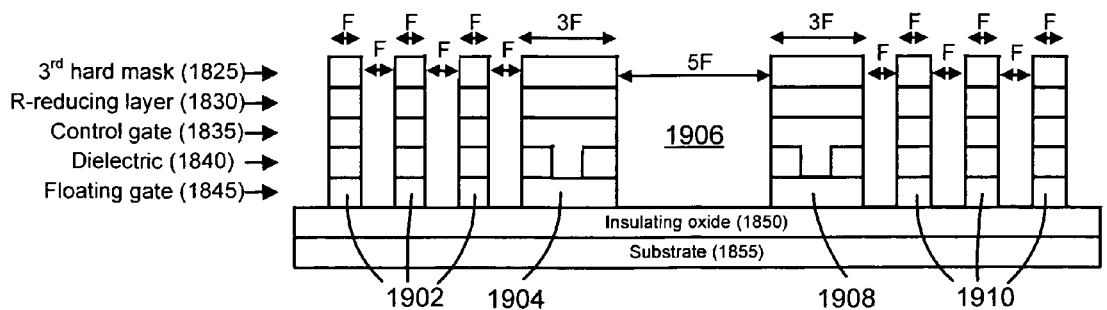
FIG. 19 depicts a layered semiconductor material which results from the layered semiconductor material of FIG. 18.

FIG. 19 illustrates a layered semiconductor material 1900 which results from the layered semiconductor material 1800 and the analogous intermediate steps as discussed previously. In particular the layered semiconductor material 1900 includes, on one side of a gap 1906 of width 5 F, a select gate 1904 of width of 3 F and memory elements 1902 of width F spaced apart by a distance F, and, on the other side of the gap 1906, a select gate 1908 of width of 3 F and memory elements 1910 of width F spaced apart by a distance F.

Figure 20:
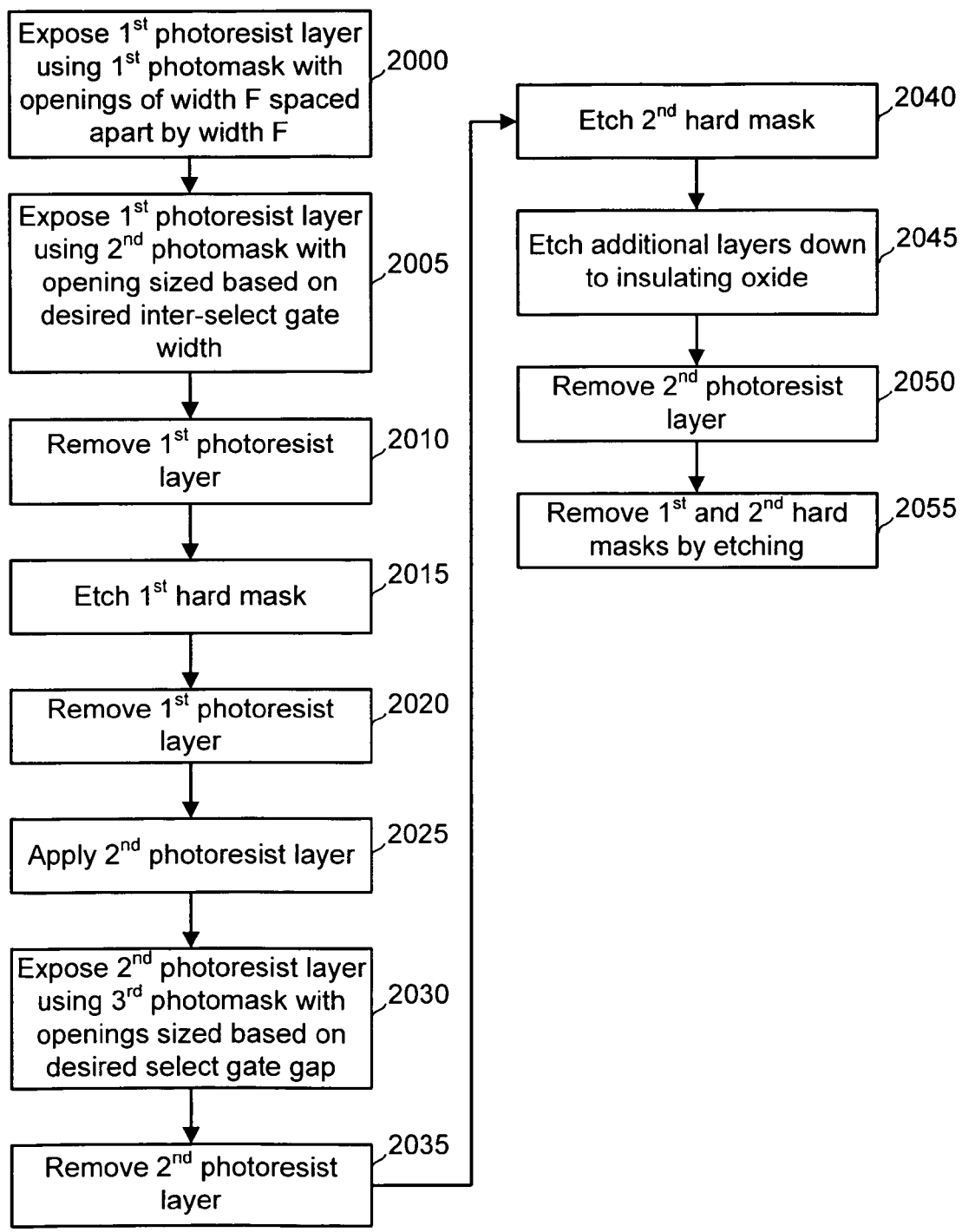
FIG. 20 depicts a process for fabricating the layered semiconductor materials of FIG. 17 or FIG. 19.

FIG. 20 depicts a process for fabricating the semiconductor structure of FIG. 17 or FIG. 19, in one possible approach. Step 2000 involves exposing a first photoresist layer of the starting layered semiconductor material using a first photomask with openings of width F spaced apart by width F. At step 2005, the first photoresist layer is exposed using a second photomask, which has an opening that is sized based on the desired inter-select gate gap. The first photoresist layer is removed, at step 2010, the first hard mask is etched through the first photoresist layer, at step 2015, and the first photoresist layer is removed, at step. 2020. Next, at step 2025, a second photoresist layer is applied, and at step 2030, the second photoresist layer is exposed using a third photomask which has openings that are sized based on the desired select gate width. At step 2035, the second photoresist layer is removed. At step 2040, the second hard mask is etched, and at step 2045 the additional layers are etched down to the insulating oxide. At step 2050 the second photoresist layer is removed, and at step 2055, the first and second hard masks are removed by etching.

Further fabrication techniques are used to add contacts, connections and other required components as will be appreciated by those skilled in the art to produce the final non-volatile memory device.

EXAMPLE #2

Fabrication using Respective Exposures of Three Photoresist Layers

A second example implementation is provided for fabricating a semiconductor memory device having a gate width as small as approximately 45-55 nm or less using existing lithographic techniques in which a photomask having a fixed periodic feature size F is used. In this example, three photoresist layers are patterned using respective photomasks.

Figure 21:
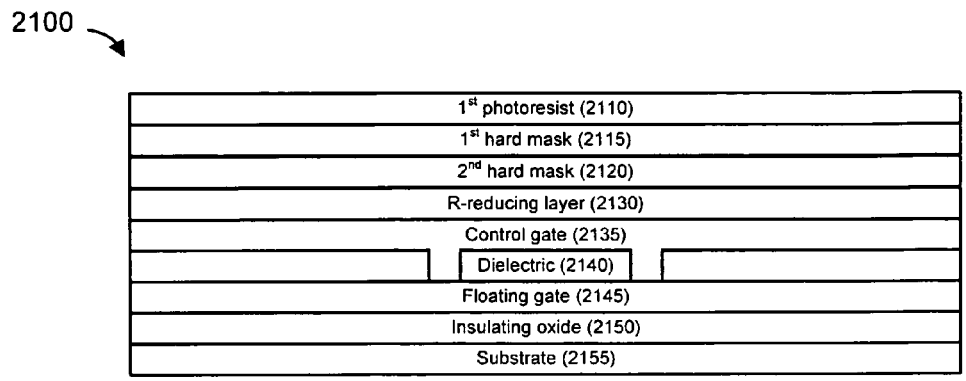
FIG. 21 depicts a cross-sectional view of an alternative unpatterned layered semiconductor material.
Figure 22:
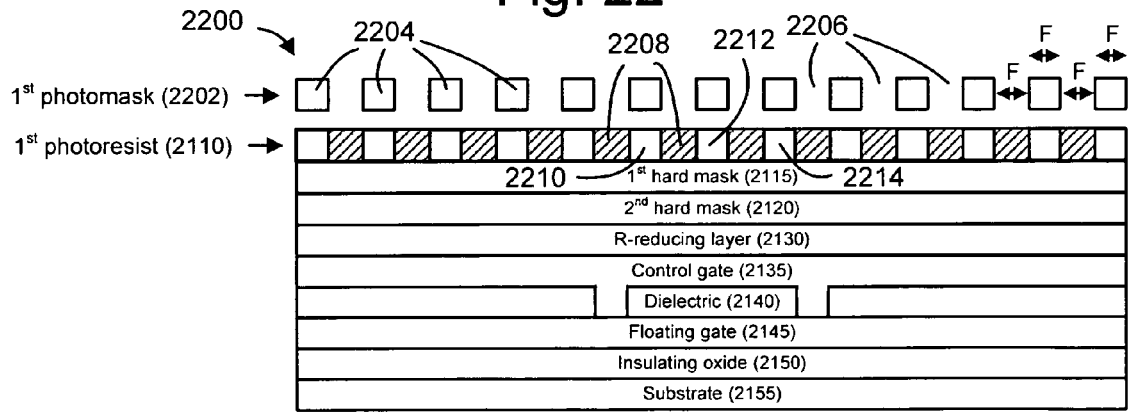
FIG. 22 depicts the transferring of a pattern of a first photomask to the layered semiconductor material of FIG. 21.
Figure 23:
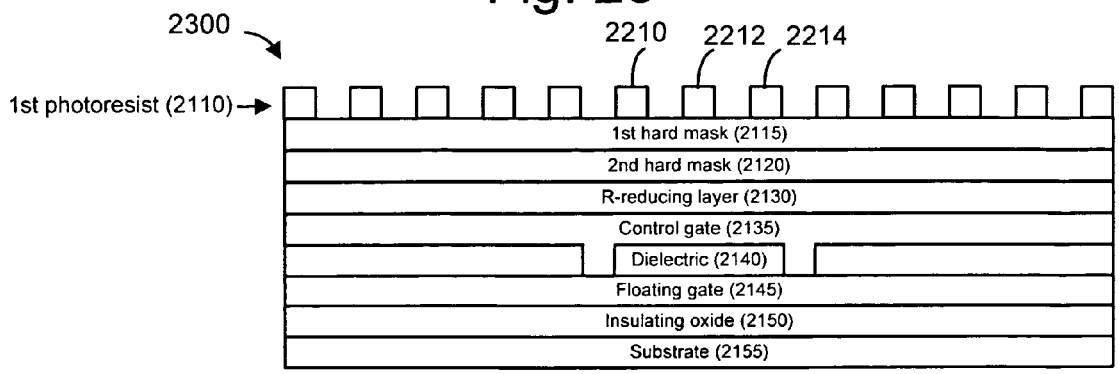
FIG. 23 depicts unexposed portions of the first photoresist layer of the layered semiconductor material of FIG. 22.

In FIG. 21, the layered semiconductor material 2100 is analogous to the layered semiconductor material 500 of FIG. 5, but does not include a third hard mask. In particular, the layered semiconductor material 2100 includes a substrate layer 2155, an insulating oxide layer 2150, a floating gate layer 2145, a dielectric layer 2140, a control gate layer 2135, a resistance reducing layer 2130, a second hard mask layer 2120, a first hard mask layer 2115, and a first photoresist layer 2110. Here, again, a first photomask 2202 having a pattern with alternating opaque regions, such as opaque regions 2204, and spaces, such as spaces 2206, each having a width F, can be used. The first photoresist layer 2110 is exposed through the openings in the first photomask 2202 resulting in an alternating pattern of exposed regions, such as regions 2208, and unexposed regions, such as regions 2210, 2212 and 2214. The first photomask 2202 and the first photoresist layer 2110 are removed, resulting in the layered semiconductor material 2300 of FIG. 23. The compositions of the layers may be provided as discussed above in connection with FIG. 5.

Figure 24:
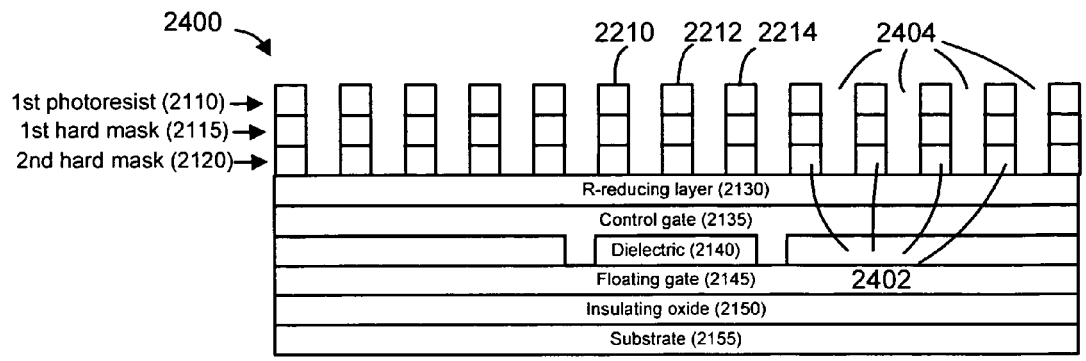
FIG. 24 depicts the layered semiconductor material of FIG. 23 after first and second hard mask layers are removed.
Figure 25:
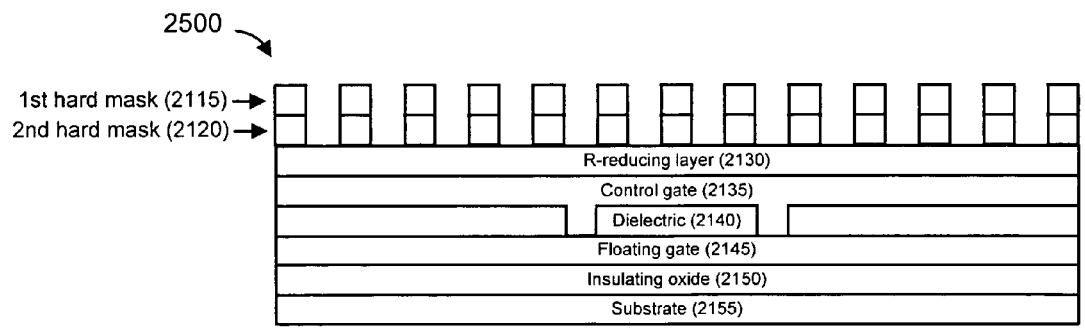
FIG. 25 depicts the layered semiconductor material of FIG. 24 after the remaining unexposed portions of the first photoresist layer are removed.

The layered semiconductor material 2300 includes the remaining unexposed portions of the first photoresist layer 2110, such as portions 2210, 2212 and 2214. The layered semiconductor material 2300 is etched through the openings in the first photoresist layer 2110, thereby removing portions of the first hard mask layer 2115 and the second hard mask layer 2120, and resulting in the layered semiconductor material 2400 of FIG. 24. Essentially, the pattern of the first photoresist layer 2110 is transferred to the first and second hard mask layers, resulting in a number of structures, such as structures 2402 which are separated by gaps, such as gaps 2404. The first photoresist layer 2110 is removed, resulting in the layered semiconductor material 2500 of FIG. 25.

Figure 26:
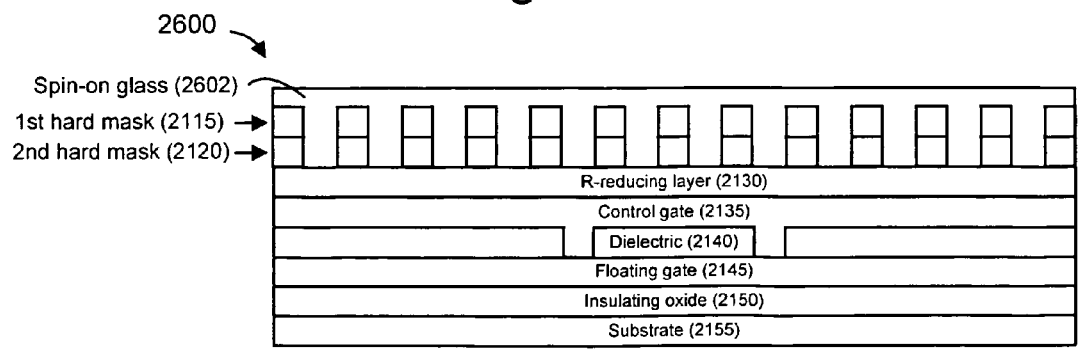
FIG. 26 depicts the layered semiconductor material of FIG. 25 after a spin-on glass layer has been added.

In the layered semiconductor material 2600 of FIG. 26, a spin-on glass layer or film 2602 is applied over the remaining portions of the first and second hard masks. Spin-on glass refers, e.g., to a solvent-based liquid that is applied to substrates using a spin-coat process to form a thin, solid film exhibiting the properties of silicon dioxide after curing.

Figure 27:
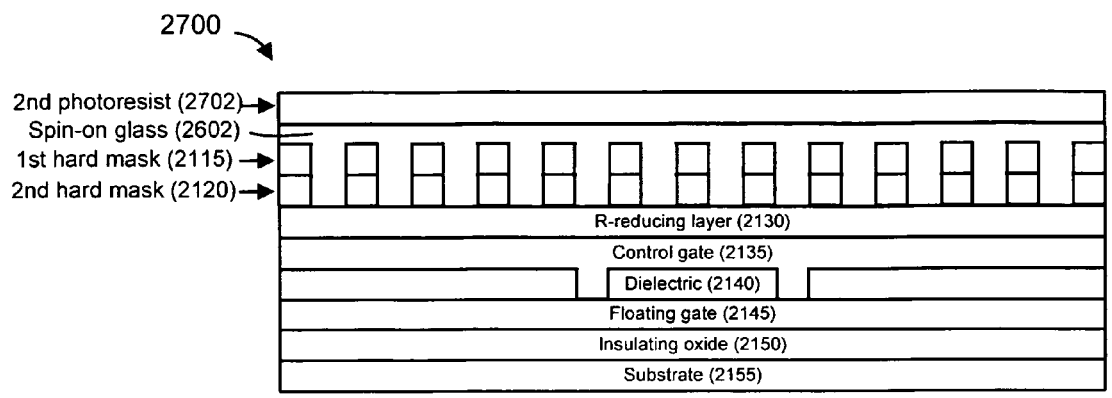
FIG. 27 depicts the layered semiconductor material of FIG. 26 after a second photoresist layer has been added.

In the layered semiconductor material 2700 of FIG. 27, a second photoresist layer 2702 is applied over the spin-on glass layer 2602.

Figure 28:
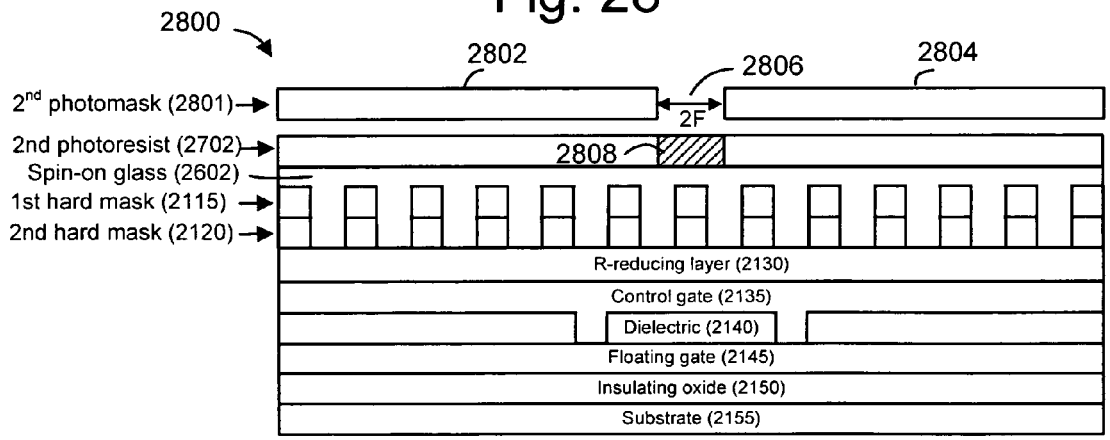
FIG. 28 depicts the transferring of a pattern from a second photomask to the layered semiconductor material of FIG. 27.
Figure 29:
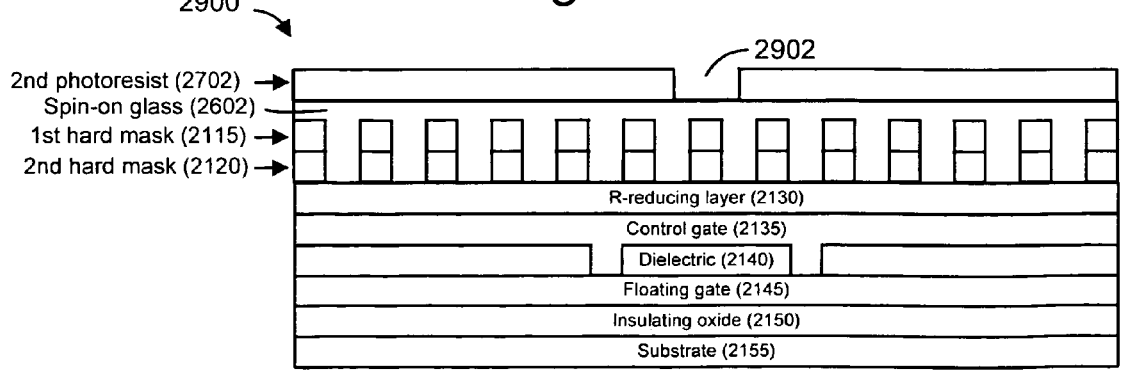
FIG. 29 depicts the layered semiconductor material of FIG. 28 after the exposed portion of the second photoresist layer has been removed.

In the layered semiconductor material 2800 of FIG. 28, a pattern of a second photomask 2801 is transferred to the second photoresist layer 2702. The second photomask 2801 includes opaque portions 2802 and 2804 separated by an opening 2806, e.g., of width 2 F. The opening 2806 is wider than F but less than the width of the inter-select gate gap which is subsequently formed. A portion 2808 of the second photoresist layer 2702 which is under the opening 2806 is exposed through the opening 2806. The second photomask 2801 and the second photoresist layer 2702 are removed, resulting in the layered semiconductor material 2900 of FIG. 29.

Figure 30:
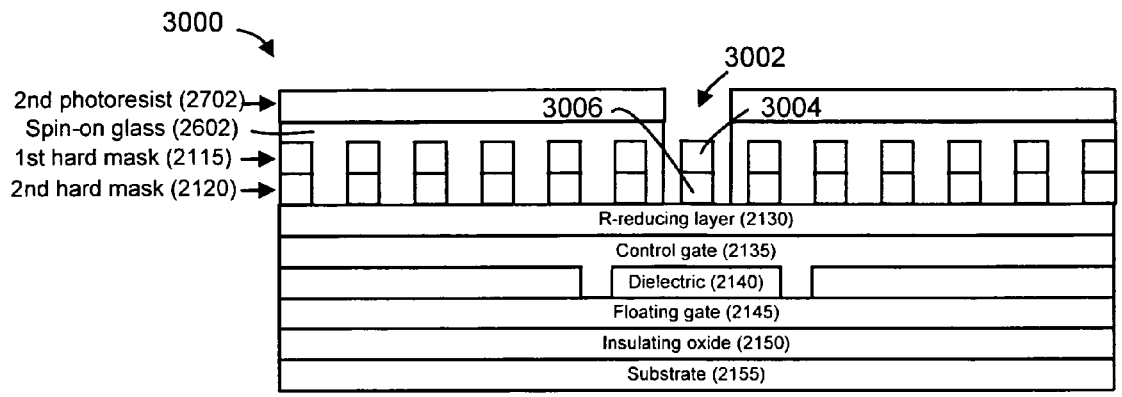
FIG. 30 depicts the layered semiconductor material of FIG. 29 after a portion of the spin-on glass layer has been removed.
Figure 31:
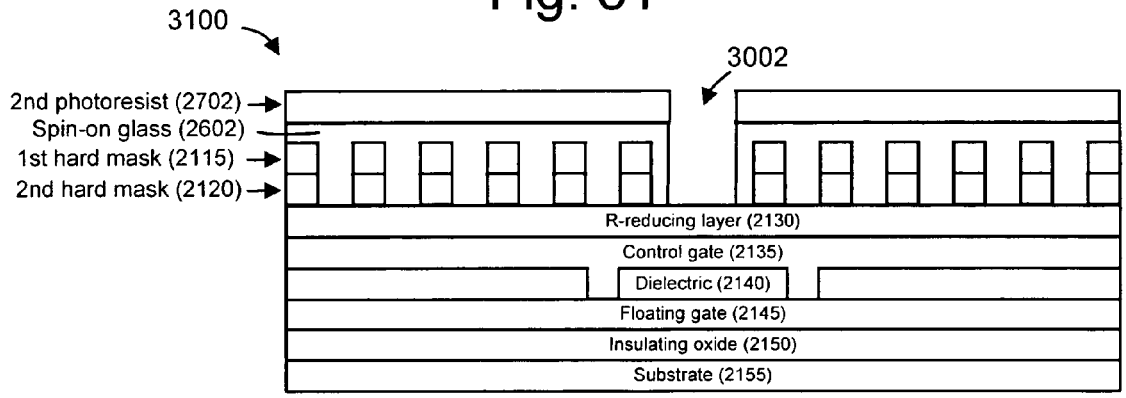
FIG. 31 depicts the layered semiconductor material of FIG. 30 after portions of the first and second hard masks are removed.

In the layered semiconductor material 2900, a gap 2902 is provided in the second photoresist layer 2702. The layered semiconductor material 2900 is subsequently subjected to a process which results in the layered semiconductor material 3000 of FIG. 30. In particular, portions of the spin-on glass layer 2602 which are below the opening 2902 are removed, thereby leaving a portions of the first hard mask 2115 and the second hard mask 2120. In particular, a portion 3004 of the first hard mask 2115 and a portion 3006 of the second hard mask 2120 are exposed in a gap 3002. The process performed acts on the spin-on glass layer 2602 but not the first or second hard masks. Subsequently, an etch that acts on the first and second hard mask portions 3004 and 3006, respectively, is performed, resulting in the layered semiconductor material 3100 of FIG. 31.

Figure 32:
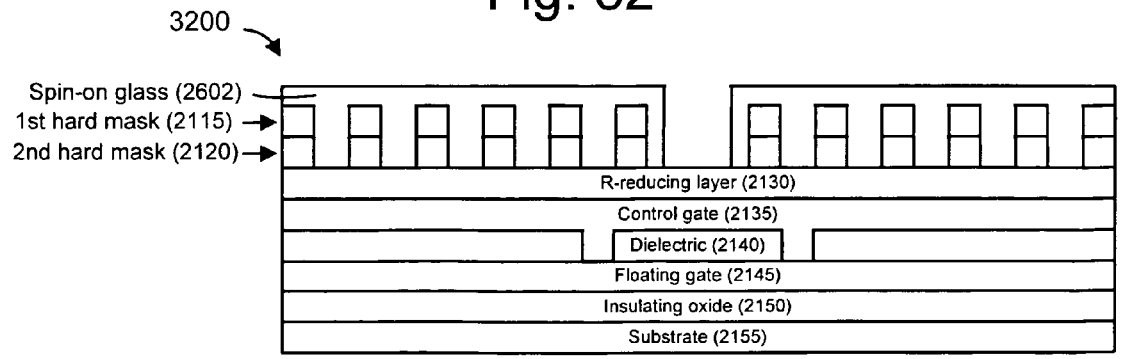
FIG. 32 depicts the layered semiconductor material of FIG. 31 after the second photoresist layer is removed.
Figure 33:
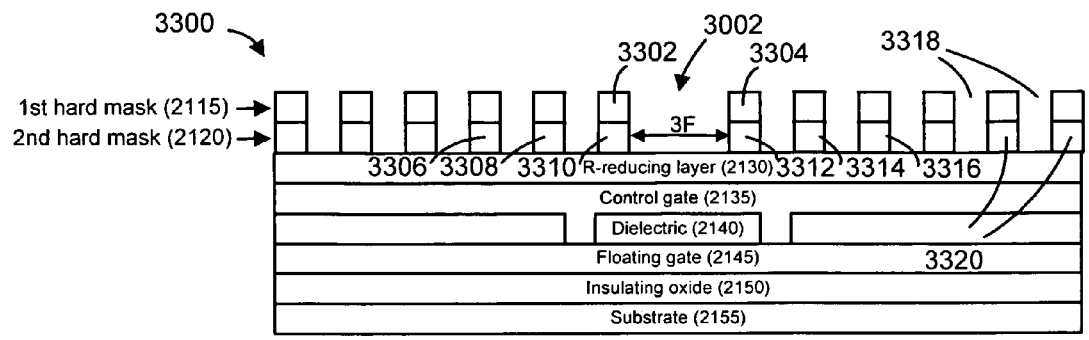
FIG. 33 depicts the layered semiconductor material of FIG. 32 after the spin-on glass layer has been removed.

Subsequently, the second photoresist layer 2702 is removed, e.g., stripped away, resulting in the layered semiconductor material 3200 of FIG. 32. The spin-on glass layer 2602 is then removed, resulting in the layered semiconductor material 3300 of FIG. 33.

Figure 34:
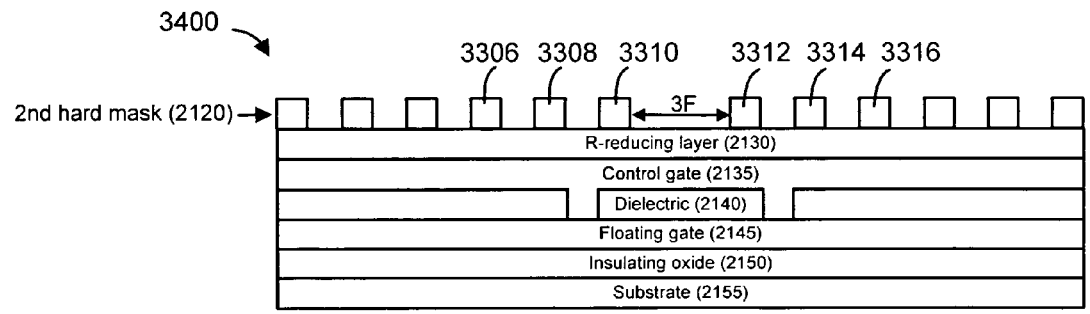
FIG. 34 depicts the layered semiconductor material of FIG. 33 after the remaining portions of the first hard mask are removed.
Figure 35:
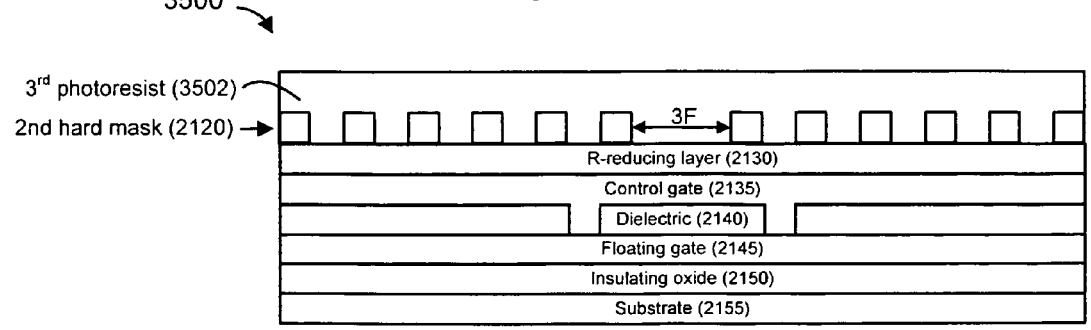
FIG. 35 depicts the layered semiconductor material of FIG. 34 after a third photoresist layer has been added.

The layered semiconductor material 3300 includes alternating structures formed by the first and second hard masks, such as structures 3320, separated by gaps, such as gaps 3318. The inter-select gate gap 3002 is 3 F. Also depicted are portions 3302 and 3304 of the first hard mask 2115, and portions 3306, 3308, 3310, 3312, 3314 and 3316 of the second hard mask 2120. The second hard mask portions 3310 and 3312 are first closest to the gap 3002, the second hard mask portions 3308 and 3314 are second closest to the gap 3002, and the third hard mask portions 3306 and 3316 are third closest to the gap 3002. The layered semiconductor material 3300 is then etched to remove the remaining first hard mask portions, resulting in the layered semiconductor material 3400 of FIG. 34. A third photoresist layer 3502 is applied to the layered semiconductor material 3400, resulting in the layered semiconductor material 3500 of FIG. 35.

In the layered semiconductor material 3600 of FIG. 36, a pattern of a third photomask 3601 is transferred to the third photoresist layer 3502. The third photomask 3601 includes opaque portions 3602 and 3604 separated by a distance which is greater than the gap 3002. For example, the distance may be 4 F when the gap 3002 is 3 F. The third photoresist layer 3502 consequently includes unexposed portions 3608 and 3610 underneath the opaque portions 3602 and 3604, respectively, on either side of the gap 3002.

The layered semiconductor material 3700 of FIG. 37 results when the third photomask is removed, and the third photoresist layer 3502 is removed, e.g., by exposing and developing. FIG. 37 indicates how the unexposed portions 3606 and 3608 cover and extend at least partly across openings 3702 and 3704 between the second hard mask portions 3308 and 3310, and 3312 and 3314, respectively. The unexposed portions 3606 and 3608 protect the openings 3702 and 3704 during subsequent etching and may therefore be considered to be protective portions of the third photoresist layer 3502.

In particular, the layered semiconductor material of 3800 of FIG. 38 results when the layered semiconductor material 3700 is etched down to the insulating oxide layer 2150 through the openings in the second hard mask 2120. In particular, the layered semiconductor material 3800 includes select gates 3806 and 3808 of width 3 F on either side of the gap 3002, which also has a width of 3 F, and memory element structures, such as structures 3802 separated by gaps 3804, and structures 3810 separated by gaps 3812. The unexposed portions 3606 and 3608 of the third photoresist layer 3502 may be worn away somewhat during this etch.

Figure 39:
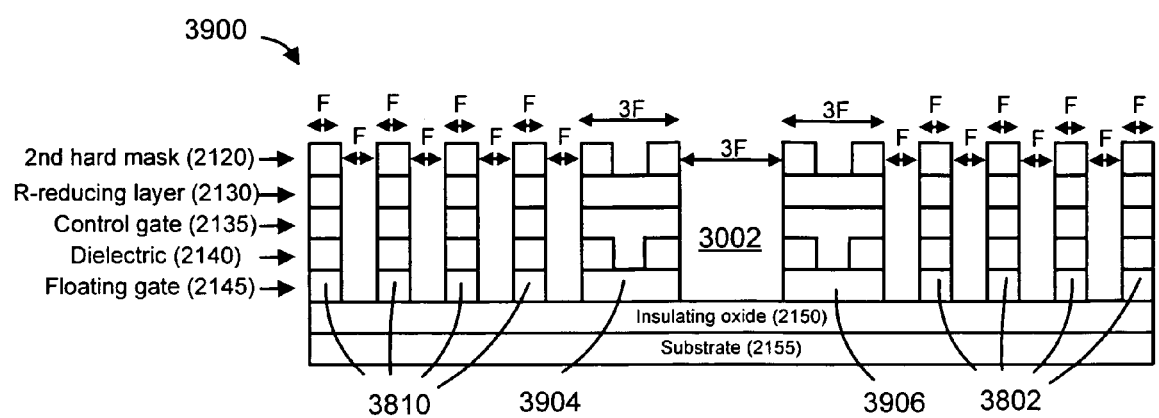
FIG. 39 depicts the layered semiconductor material of FIG. 38 after removing the unexposed portions of the third photoresist layer.

The layered semiconductor material 3900 of FIG. 39 results when the unexposed portions of the third photoresist layer 3502, namely portions 3606 and 3608, are removed, e.g., by exposing and developing. The final layered semiconductor material 3900 is analogous to the layered semiconductor material 1700 of FIG. 17. Specifically, the layered semiconductor material 3900 includes select gates 3904 and 3906 of width 3 F separated by the inter-select gate gap 3002 of width 3 F, and the memory elements 3802 and 3810 of width F separated by gaps of width F.

Further fabrication techniques are performed to add contacts, connections and other required components as will be appreciated by those skilled in the art to produce the final non-volatile memory device.

Figure 40:
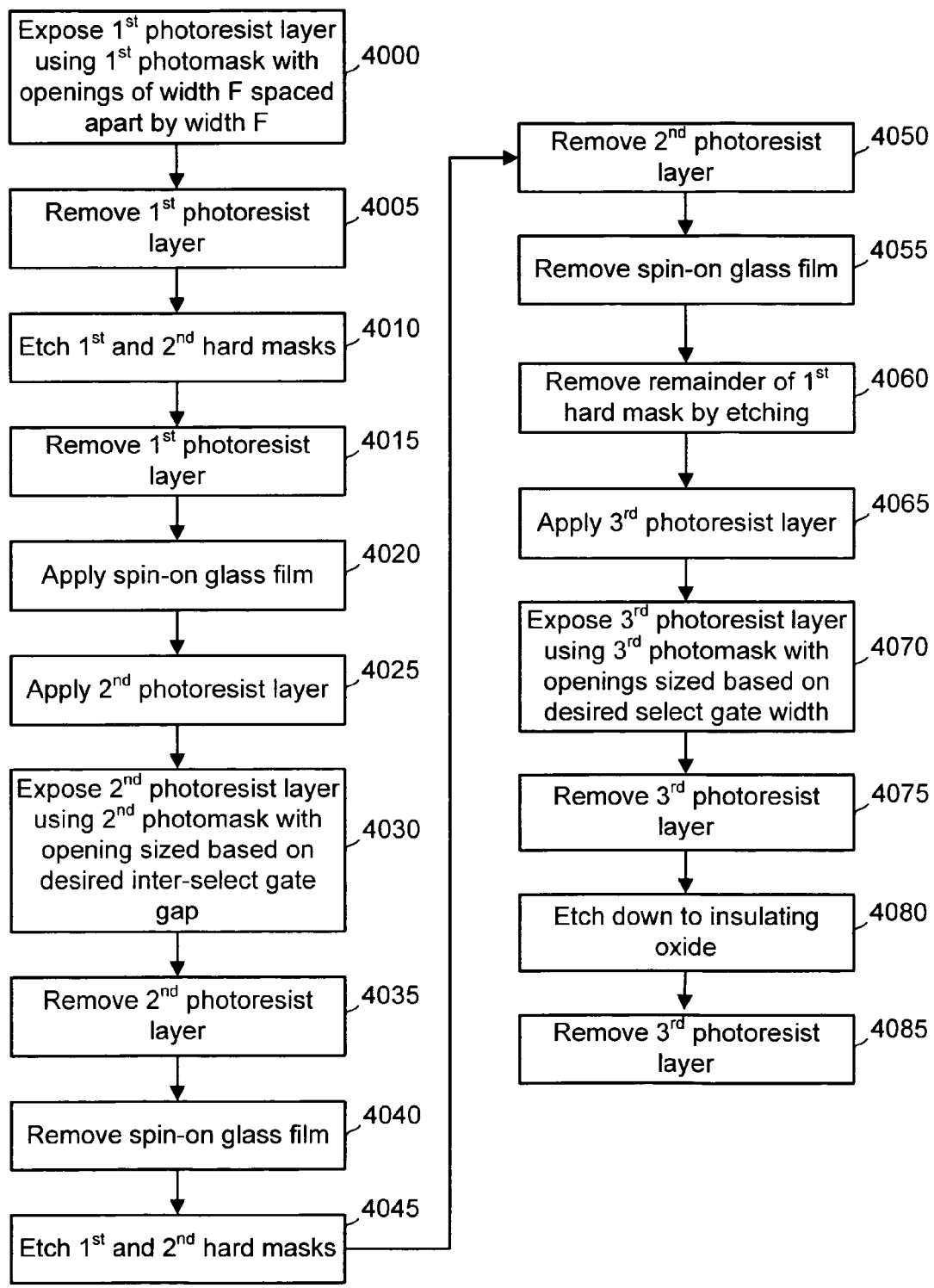
FIG. 40 depicts a process for fabricating the layered semiconductor material of FIG. 39.

FIG. 40 depicts a process for fabricating the layered semiconductor material of FIG. 39. Step 4000 involves exposing a first photoresist layer using a first photomask with openings of width F spaced apart by width F. At step 4005, the first photoresist layer is removed, and at step 4010, the first and second hard masks are etched through the openings in the first photoresist layer. The first photoresist layer is removed, at steps 4015, the spin-on glass layer is applied at step 4020, and a second photoresist layer is applied at step 4025. At step 4030, the second photoresist layer is exposed using the second photomask which has an opening sized based on the desired inter-select gate gap. At step 4035, the second photoresist layer is removed, and at step 4040, the spin-on glass layer is removed via an opening in the second photoresist layer. At step 4045, the first and second hard masks are etched through the opening in the second photoresist layer. At step 4050, the second photoresist layer is removed, and at step 4055, the spin-on glass layer is removed. At step 4060, the remainder of the first hard mask is removed by etching. At step 4065, a third photoresist layer is applied, and at step 4070, the third photoresist layer is exposed using a third photomask with openings that are sized based on a desired select gate width. At step 4075, the third photoresist layer is removed, and at step 4080, the resulting layered semiconductor material is etched down to the insulating oxide layer. Finally, at step 4085, the third photoresist layer is removed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for fabricating a semiconductor device, comprising:

transferring a pattern from an initial photomask to a first photoresist layer of a layered structure, the first photoresist layer having alternating unexposed portions of width F and exposed portions, the initial photomask having a feature of width at least F to expose at least one of the unexposed portions, thereby forming, in the first photoresist layer, a first pattern which includes a gap having a width of at least 3F, the gap extends between two adjacent unexposed portions of the first pattern of the first photoresist layer;

transferring the first pattern to a first hard mask below the first photoresist layer, forming spaced apart portions in the first hard mask on opposing sides of the gap;

removing remaining portions of the first photoresist layer;

transferring a pattern from an additional photomask having a pattern of features of width at least F to a second photoresist layer which is added to the spaced apart portions of the first hard mask, thereby forming protective regions in the second photoresist layer on opposing sides of the gap, each protective region extending between at least two of the spaced apart portions in the first hard mask; and removing additional layers in the layered structure through openings, including the gap, in the first hard mask which are not protected by the protective regions.

2. The method of claim 1, wherein:

the pattern is transferred from the initial photomask to the first photoresist layer after a pattern is transferred from a photomask having a periodic pattern of features of width F to the first photoresist layer to form the alternating unexposed portions of width F and exposed portions.

3. The method of claim 1, wherein:

the first photoresist layer comprises a positive photoresist; and the feature of width at least F in the initial photomask comprises an opening.

4. The method of claim 3, wherein:

the openings in the initial photomask are spaced apart by a distance F.

5. The method of claim 1, wherein:

the second photoresist layer comprises a positive photoresist; and the features of width at least F in the additional photomask are opaque.

6. The method of claim 1, wherein:

F is approximately 55 nm or less.

7. The method of claim 1, wherein:

the feature of width at least F in the initial photomask exposes at least two of the unexposed portions in the first photoresist layer; and the gap has a width of at least 5 F.

8. The method of claim 1, wherein:
the width of the feature of the initial photomask is less than a width of the gap.

9. A method for fabricating a semiconductor device, comprising:
transferring patterns from first and second photomasks to a first photoresist layer of a layered structure, the first photomask having a periodic pattern of features of width F, the second photomask having a feature of width at least F, thereby forming, in the first photoresist layer, a first pattern which includes a gap having a width of at least 3 F and, on opposing sides of the gap, spaced apart photoresist portions of width F;
transferring the first pattern to a first hard mask below the first photoresist layer, forming spaced apart portions in the first hard mask on opposing sides of the gap;
removing remaining portions of the first photoresist layer;
transferring a pattern from a third photomask having a pattern of features of width at least F to a second photoresist layer which is added to the spaced apart portions of the first hard mask, thereby forming protective regions in the second photoresist layer on opposing sides of the gap, each protective region extending between at least two of the spaced apart portions in the first hard mask; and
removing additional layers in the layered structure through openings, including the gap, in the first hard mask which are not protected by the protective regions.

10. The method of claim 9, wherein:
the first photoresist layer comprises a positive photoresist;
the features of width F in the first photomask comprise openings; and
the feature of width at least F in the second photomask comprises an opening.

11. The method of claim 10, wherein:
the openings in the first photomask are spaced apart by a distance F.

12. The method of claim 9, wherein:
the second photoresist layer comprises a positive photoresist; and
the features of width at least F in the third photomask are opaque.

13. The method of claim 9, wherein:
the additional layers are removed by etching.

14. The method of claim 9, wherein:
the additional layers are removed down to an insulating oxide layer.

15. The method of claim 9, wherein:
the transferring of the patterns from first and second photomasks to the first photoresist layer comprises exposing the first photoresist layer through the first photomask, subsequently exposing the first photoresist layer through the second photomask, and developing the first photoresist layer.

16. The method of claim 9, wherein:
the transferring of the first pattern to the first hard mask comprises etching the first hard mask through openings in the first photoresist layer.

17. The method of claim 9, wherein:
the transferring of the pattern from the third photomask to the second photoresist layer comprises exposing the second photoresist layer through the third photomask, and subsequently developing the second photoresist layer.

18. The method of claim 9, wherein:
the removing of the additional layers forms, in the additional layers, a pattern which includes the gap having the width of at least 3 F and, on opposing sides of the gap, a select gate portion having a width of at least 3 F, and alternating memory element portions of width F spaced apart by a distance F.

19. The method of claim 9, wherein:
the removing of the additional layers forms, in the additional layers, a pattern which includes the gap having the width of at least 3 F and, on opposing sides of the gap, a select gate portion having a width of at least 3 F, and alternating, spaced apart, memory element portions of width F.

20. The method of claim 9, wherein:
on the opposing sides of the gap, each protective region extends between at least two of the spaced apart portions in the first hard mask which are first and second closest to the gap.

21. The method of claim 9, wherein:
on the opposing sides of the gap, each protective region extends between at least two of the spaced apart portions in the first hard mask which are first and third closest to the gap.

22. The method of claim 9, wherein:
on the opposing sides of the gap, each protective region extends between, and at least partly across, the at least two of the spaced apart portions in the first hard mask.

23. The method of claim 9, wherein:
F is approximately 55 nm or less.

24. The method of claim 9, wherein:
the gap has a width of at least 5 F.

25. The method of claim 9, wherein:
the width of the feature of the second photomask is less than a width of the gap.

26. The method of claim 9, further comprising:
following the removing of the additional layers, removing the protective regions in the second photoresist layer and remaining portions of the first hard mask.

27. The method of claim 9, wherein:
the additional layers which are removed include a control gate layer, a floating gate layer, and a dielectric layer between the control gate layer and the floating gate layer.

28. The method of claim 27, wherein:
the additional layers which are removed include a resistance reducing layer between the first hard mask and the control gate layer.

29. The method of claim 27, wherein:
the additional layers which are removed include a second hard mask.

30. The method of claim 29, wherein:
the additional layers which are removed include a third hard mask between the second hard mask and the control gate layer.

31. A method for fabricating a semiconductor device, comprising:
transferring a pattern from an initial photomask having a feature of width at least F to an initial photoresist layer which is added to a film which is formed over spaced apart portions of at least a first hard mask in a layered structure, the spaced apart portions of the at least a first hard mask having a width of F, thereby forming, in the initial photoresist layer, an opening of width at least F;
removing a portion of the film below the opening;
removing at least one of the spaced apart portions of the at least a first hard mask below the opening;
removing remaining portions of the initial photoresist layer;

removing remaining portions of the film, thereby leaving the spaced apart portions of the at least a first hard mask on opposing sides of a gap of width at least 3 F;

transferring a pattern from an additional photomask having features of width at least F to an additional photoresist layer which is added to the spaced apart portions of the at least a first hard mask, thereby forming protective regions in the additional photoresist layer on opposing sides of the gap, each protective region extending between at least two of the spaced apart portions of the at least a first hard mask; and removing additional layers in the layered structure through openings, including the gap, in the at least a first hard mask which are not protected by the protective regions.

32. The method of claim 31, wherein:
the additional photoresist layer comprises a positive photoresist; and
the feature of width at least F in the initial photomask comprises an opening.

33. The method of claim 31, wherein:
the additional photoresist layer comprises a positive photoresist; and
the features of width at least F in the additional photomask comprise opaque regions.

34. The method of claim 31, wherein:
F is approximately 55 nm or less.

35. The method of claim 31, wherein:
the gap has a width of at least 5 F.

36. The method of claim 31, wherein:
the width of the feature of the initial photomask is less than a width of the gap.

37. A method for fabricating a semiconductor device, comprising:
transferring a pattern from a first photomask to a first photoresist layer of a layered structure, the first photomask having a periodic pattern of features of width F, thereby forming, in the first photoresist layer, a first pattern which includes spaced apart portions of width F;
transferring the first pattern to at least a first hard mask below the first photoresist layer, forming spaced apart portions of width F in the at least a first hard mask;
removing remaining portions of the first photoresist layer;
forming a film over the spaced apart portions of the at least a first hard mask;
transferring a pattern from a second photomask having a feature of width at least F to a second photoresist layer which is added to the film, thereby forming, in the second photoresist layer, an opening of width at least F;
removing a portion of the film below the opening;
removing at least one of the spaced apart portions of the at least a first hard mask below the opening;
removing remaining portions of the second photoresist layer;
removing remaining portions of the film, thereby leaving spaced apart portions of the at least a first hard mask on opposing sides of a gap of width at least 3 F;
transferring a pattern from a third photomask having features of width at least F to a third photoresist layer which is added to the spaced apart portions of the at least a first hard mask, thereby forming protective regions in the third photoresist layer on opposing sides of the gap, each protective region extending between at least two of the spaced apart portions of the at least a first hard mask; and
removing additional layers in the layered structure through openings, including the gap, in the at least a first hard mask which are not protected by the protective regions.

38. The method of claim 37, wherein:
the film comprises spin-on glass.

39. The method of claim 37, wherein:
the at least a first hard mask comprises at least first and second hard masks.

40. The method of claim 39, further comprising:
removing remaining portions of the first hard mask after the removing of the remaining portions of the film, and prior to the transferring of the pattern from the third photomask.

41. The method of claim 37, wherein:
the first and second photoresist layers comprise positive photoresists;
the features of width F in the first photomask comprise openings; and
the feature of width at least F in the second photomask comprises an opening.

42. The method of claim 41, wherein:
the openings in the first photomask are spaced apart by a distance F.

43. The method of claim 37, wherein:
the third photoresist layer comprises a positive photoresist; and
the features of width at least F in the third photomask comprise opaque regions.

44. The method of claim 37, wherein:
the additional layers are removed down to an insulating oxide layer.

45. The method of claim 37, wherein:
the transferring of the pattern from the first photomask to the first photoresist layer comprises exposing the first photoresist layer through the first photomask, and subsequently developing the first photoresist layer;
the transferring of the pattern from the second photomask to the second photoresist layer comprises exposing the second photoresist layer through the second photomask, and subsequently developing the second photoresist layer; and
the transferring of the pattern from the third photomask to the third photoresist layer comprises exposing the third photoresist layer through the third photomask, and subsequently developing the third photoresist layer.

46. The method of claim 37, wherein:
the transferring of the first pattern to the at least a first hard mask comprises etching the at least a first hard mask through openings in the first photoresist layer.

47. The method of claim 37, wherein:
the removing of the additional layers forms, in the additional layers, a pattern which includes the gap having the width of at least 3 F and, on opposing sides of the gap, a select gate portion having a width of at least 3 F, and alternating memory element portions of width F spaced apart by a distance F.

48. The method of claim 37, wherein:
the removing of the additional layers forms, in the additional layers, a pattern which includes the gap having the width of at least 3 F and, on opposing sides of the gap, a select gate portion having a width of at least 3 F, and alternating, spaced apart, memory element portions of width F.

49. The method of claim 37, wherein:
on the opposing sides of the gap, each protective region extends between at least two of the spaced apart portions in the at least a first hard mask which are first and second closest to the gap.

50. The method of claim 37, wherein:
on the opposing sides of the gap, each protective region extends between at least two of the spaced apart portions in the at least a first hard mask which are first and third closest to the gap.

51. The method of claim 37, wherein:
on the opposing sides of the gap, each protective region extends between, and at least partly across, the at least two of the spaced apart portions in the at least a first hard mask.

52. The method of claim 37, wherein:
F is approximately 55 nm or less.

53. The method of claim 37, wherein:
the gap has a width of at least 5 F.

54. The method of claim 37, wherein:
the width of the feature of the second photomask is less than a width of the gap.

55. The method of claim 37, further comprising:
following the removing of the additional layers, removing the protective regions in the third photoresist layer.

56. The method of claim 37, wherein:
the additional layers which are removed include a control gate layer, a floating gate layer, and a dielectric layer between the control gate layer and the floating gate layer.

57. The method of claim 56, wherein:
the additional layers which are removed include a resistance reducing layer between the at least a first hard mask and the control gate layer.

58. The method of claim 37, wherein:
the additional layers are removed by etching.

* * * * *